(12) United States Patent
Huang et al.

(10) Patent No.: US 12,745,429 B2
(45) Date of Patent: Sep. 22, 2026

(54) DIFFUSION CUT STRESSORS FOR STACKED TRANSISTORS

(71) Applicant: Intel Corporation, Santa Clara, CA (US)

(72) Inventors: Cheng-Ying Huang, Hillsboro, OR (US); Munzarin F. Qayyum, Hillsboro, OR (US); Nicole K. Thomas, Portland, OR (US); Rohit Galatage, Hillsboro, OR (US); Patrick Morrow, Portland, OR (US); Jami A. Wiedemer, Scappoose, OR (US); Marko Radosavljevic, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 215 days.

(21) Appl. No.: 17/809,329

(22) Filed: Jun. 28, 2022

(65) Prior Publication Data

US 2023/0420562 A1 Dec. 28, 2023

(51) Int. Cl.

| | |
|---|---|
| ***H10D 30/69*** | (2025.01) |
| ***H10D 30/01*** | (2025.01) |
| ***H10D 30/67*** | (2025.01) |
| ***H10D 62/10*** | (2025.01) |

(52) U.S. Cl.
CPC ......... *H10D 30/797* (2025.01); *H10D 30/024* (2025.01); *H10D 30/6735* (2025.01); *H10D 30/6757* (2025.01); *H10D 62/121* (2025.01)

(58) Field of Classification Search
CPC ....... H10D 30/791–798; H10D 30/019; H10D 30/501; H10D 84/832; H10D 84/851; H10D 30/6735; H10D 80/25; H10D 88/00–01
See application file for complete search history.

(56) References Cited

U.S. PATENT DOCUMENTS

| | | | | |
|---|---|---|---|---|
| 2019/0131395 A1* | 5/2019 | Lee | ...................... | H10D 64/017 |
| 2022/0302172 A1* | 9/2022 | Hong | .................. | H10D 30/014 |
| 2022/0352032 A1* | 11/2022 | Lilak | ................. | H10D 84/0149 |
| 2023/0343823 A1* | 10/2023 | Baek | ...................... | H10D 30/43 |

* cited by examiner

*Primary Examiner* — Britt Hanley
*Assistant Examiner* — Jason James Greaving
(74) *Attorney, Agent, or Firm* — Arcane Law PLLC

(57) ABSTRACT

Techniques are provided herein to form non-planar semiconductor devices in a stacked transistor configuration adjacent to stressor materials. In one example, an n-channel device and a p-channel device may both be gate-all-around transistors each having any number of nanoribbons extending in the same direction, where the n-channel device is located vertically above the p-channel device (or vice versa). Source or drain regions are adjacent to both ends of the n-channel device and both ends of the p-channel device. On the opposite side of the stacked source or drain regions (e.g., opposite from the nanoribbons), stressor materials may be used to fill the gate trench in place of additional semiconductor devices. The stressor materials may include, for instance, a compressive stressor material adjacent to the p-channel device and/or a tensile stressor material adjacent to the n-channel device. The stressor material(s) may form or otherwise be part of a diffusion cut structure.

20 Claims, 35 Drawing Sheets

DIFFUSION CUT STRESSORS FOR STACKED TRANSISTORS

FIELD OF THE DISCLOSURE

The present disclosure relates to integrated circuits, and more particularly, to the formation of stressor materials for stacked transistor devices.

BACKGROUND

As integrated circuits continue to scale downward in size, a number of challenges arise. For instance, reducing the size of memory and logic cells or otherwise increasing device density is becoming increasingly more difficult. One possible solution to increase device density is to stack transistor devices in a vertical direction. There are many non-trivial challenges involved with the fabrication of such stacked devices.

Figure 1A:
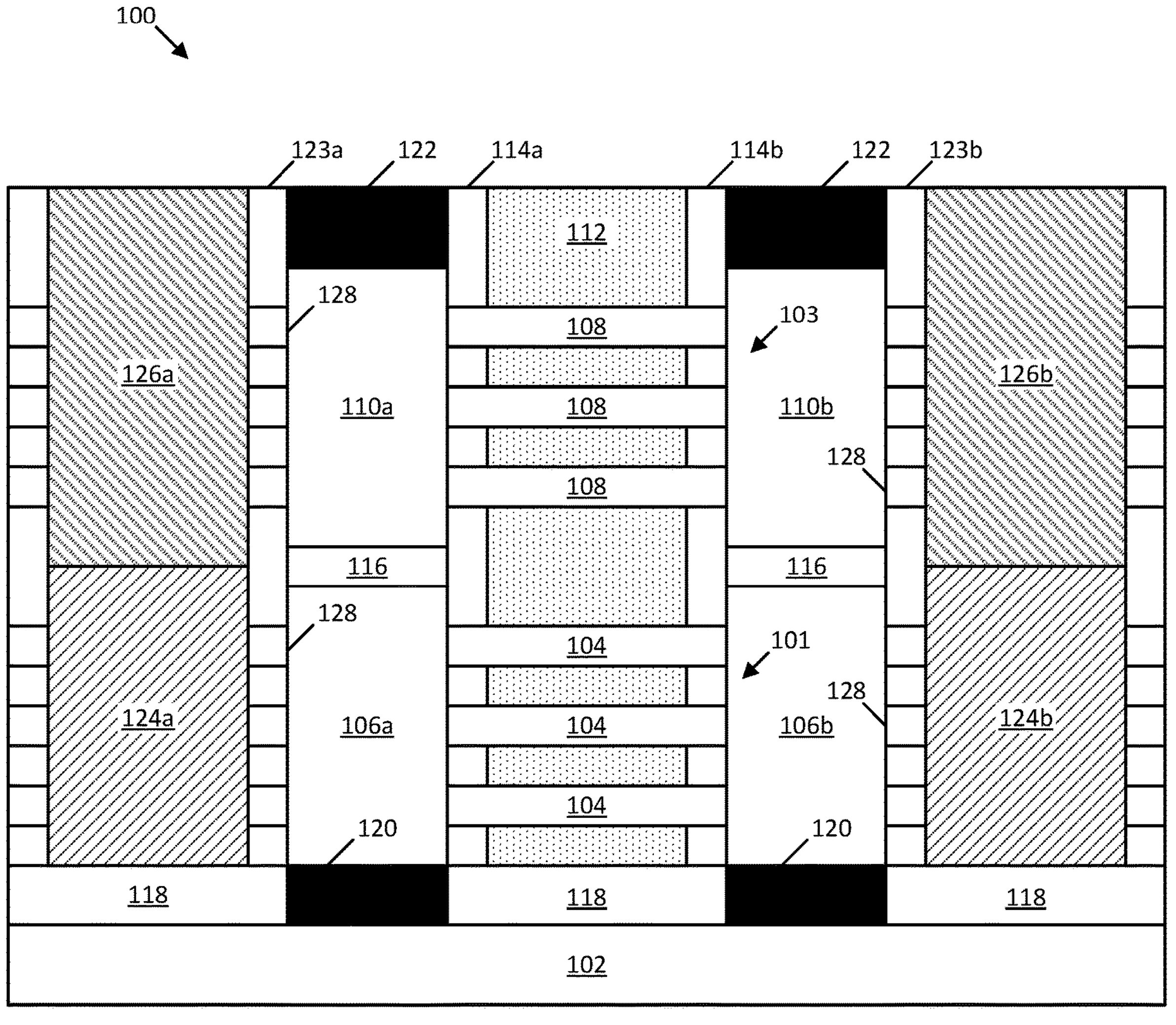
FIG. 1A is a cross-sectional view of an example integrated circuit having stacked semiconductor devices adjacent to diverse (e.g., compressive and tensile) stressor materials in the upper and lower regions, respectively, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form non-planar semiconductor devices in a stacked transistor configuration in which one or each of the upper and lower transistors is adjacent to a corresponding stressor material, such as a compressive stressor material adjacent to a lower p-channel transistor and a tensile stressor material adjacent to an upper n-channel transistor. The techniques can be used in any number of non-planar transistor technologies, but are particularly useful in a stacked nanoribbon transistor configuration (e.g., stacked in a vertical z-direction from the substrate surface) or other gate-all-around (GAA) configurations. In one example, two different semiconductor devices of a given memory or logic cell such as a synchronous random access memory (SRAM) cell, or a complementary metal oxide semiconductor (CMOS) cell, include a p-channel device and an n-channel device arranged in a stacked configuration. The n-channel device and the p-channel device may both be GAA transistors each having any number of nanoribbons extending in the same direction, where the n-channel device is located vertically above the p-channel device (or vice versa). Source or drain regions are adjacent to both ends of the n-channel device and the p-channel device, such that a source or drain region of one device is located vertically over the source or drain region of the other device. On the opposite side of the stacked source or drain regions (e.g., opposite from the nanoribbons), one or more stressor materials may be used to fill the gate trench in place of additional semiconductor devices. Deposited stressor materials are generally referred to herein as diffusion cut structures, which may include one or more layers in addition to the stressor material (e.g., such as a liner layer and/or a capping layer). Accordingly, the diffusion cut structure(s) in the gate trench acts like a cell boundary that provides isolation between different devices along a direction parallel with a length of the nanoribbons. In an example, the diffusion cut structure(s) may include a compressive stressor material adjacent to the p-channel device and a tensile stressor material adjacent to the n-channel device. Some configurations may include one type of stressor material on either the bottom or top to correspondingly provide a diffusion cut structure for either the bottom devices or the top devices in the stack. In still other configurations, the stressor material adjacent to the p-channel device and the n-channel device is the same. Numerous variations and embodiments will be apparent in light of this disclosure.

General Overview

As previously noted above, there remain a number of non-trivial challenges with respect to designing stacked semiconductor devices. For example, when forming cell boundaries in an integrated circuit, a diffusion cut can be formed in place of a gate structure to provide a break in the diffusion pathway along a row of coupled source or drain regions. However, such diffusion cut materials can cause localized stress that can negatively impact the operation of adjacent devices. This problem becomes more complicated in the case of stacked transistors, as the stress gradient can affect the stacked devices in different ways due to one device being an n-channel device and the other device being a p-channel device.

Thus, and in accordance with an embodiment of the present disclosure, techniques are provided herein to form diffusion cut structures that include compressive and/or tensile stressor materials correspondingly adjacent to one or more transistors arranged in a stacked configuration. In some embodiments, a compressive stressor material is formed adjacent to the p-channel device of the stacked transistors while no stressor material is formed adjacent to the n-channel device. In some other embodiments, a tensile stressor material is formed adjacent to the n-channel device of the stacked transistors while no stressor material is formed adjacent to the p-channel device. In still other embodiments, a tensile stressor material is formed adjacent to the n-channel device of the stacked transistors and a compressive stressor material is formed adjacent to the p-channel device. In any case, the stressor material(s) serve a dual purpose of isolating semiconductor devices from one another along a first direction parallel to a length of the nanoribbons of the n-channel device and p-channel device (by providing a diffusion cut between laterally adjacent devices), and also of supplying a beneficial stress gradient to the adjacent semiconductor device to improve its operation. For example, in the case of a p-channel device, applying compressive stress improves the mobility of the minority hole carriers. Similarly, in the case of a n-channel device, applying tensile stress improves the mobility of the minority electron carriers. Example compressive stressor materials include silicon nitride (SiN), helium implanted oxide, or various metal oxides, nitrides and carbides such as titanium aluminum nitride (TiAlN), titanium oxide (TiO), titanium aluminum carbide (TiAlC), titanium silicon oxide (TiSiO), aluminum oxide (AlO), and aluminum nitride (AlN), or combinations thereof (e.g., titanium and/or aluminum in oxynitrides, oxycarbides, oxycarbonitrides) to name a few examples. Example tensile stressor materials include curable reflowable silicon oxide. In still other embodiments, the p-channel and n-channel devices use the same stressor material in the diffusion cut structures (e.g., same liner, reflowable oxide for stressor material for both p-channel and n-channel devices, and same capping layer). Such a configuration might degrade one type of device but benefit the other. In some embodiments, a diffusion cut structure includes multiple layers, such as a liner, stressor fill material, and a capping layer.

According to an embodiment, an integrated circuit includes a first semiconductor device having one or more first bodies of semiconductor material extending in a first direction from a first source or drain region to a second source or drain region and a second semiconductor device having one or more second bodies of semiconductor material extending in the first direction from a third source or drain region to a fourth source or drain region. The one or more first bodies of semiconductor material are spaced vertically from the one or more second bodies of semiconductor material in a second direction different from (e.g., orthogonal to) the first direction and the third source or drain region is spaced vertically from the first source or drain region in the second direction. The integrated circuit also includes a first spacer structure extending in the second direction and between ends of the one or more first bodies of semiconductor material and ends of the one or more second bodies of semiconductor material, a second spacer structure extending in the second direction, the first source or drain region and the third source or drain region between the first spacer structure and the second spacer structure, and a stressor material adjacent to the second spacer structure, such that at least a portion of the second spacer structure is arranged between the stressor material and the first source or drain region. Different or same stressor materials can be used for different type devices (n-channel and p-channel devices), depending on desired benefit.

According to another embodiment, an integrated circuit includes a first semiconductor device having one or more first semiconductor nanoribbons extending in a first direction between a first p-doped source or drain region and a second p-doped source or drain region and a second semiconductor device having one or more second semiconductor nanoribbons extending in the first direction between a first n-doped source or drain region and a second n-doped source or drain region. The one or more second semiconductor nanoribbons are spaced vertically from the one or more first semiconductor nanoribbons in a second direction different from the first direction and the first n-doped source or drain region is spaced vertically from the first p-doped source or drain region in the second direction. The integrated circuit also includes a first spacer structure extending between ends of the one or more first semiconductor nanoribbons and ends of the one or more second semiconductor nanoribbons in the second direction, a second spacer structure extending in the second direction, the first n-doped source or drain region and the first p-doped source or drain region between the first spacer structure and the second spacer structure, a compressive stressor material adjacent to the second spacer structure, such that a portion of the second spacer structure is arranged between the compressive stressor material and the first p-doped source or drain region, and a tensile stressor material adjacent to the second spacer structure, such that a portion of the second spacer structure is arranged between the tensile stressor material and the first n-doped source or drain region.

According to another embodiment, a method of forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing each of the layers of the multilayer fin adjacent to the spacer structure; forming a first stressor material adjacent to a first portion of the spacer structure such that the first portion of the spacer structure is between the first stressor material and the first source or drain region; and forming a second stressor material adjacent to a second portion of the spacer structure such that the second portion of the spacer structure is between the second stressor material and the second source or drain region.

According to another embodiment, a method of forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing the first material layers and the third material layers; forming a protection layer around the fourth material layers; removing the second material layers; forming a stressor material adjacent to a portion of the spacer structure such that the portion of the spacer structure is between the stressor material and the first source or drain region; and forming a conductive material around the fourth material layers.

According to another embodiment, a method of forming an integrated circuit includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing the first material layers and the third material layers; forming a conductive material around the second material layers; removing the fourth material layers; and forming a stressor material adjacent to a portion of the spacer structure such that the portion of the spacer structure is between the stressor material and the second source or drain region.

The techniques are especially suited for use with gate-all-around transistors such as nanowire and nanoribbon transistors but may also be applicable in some instances to finFET devices (e.g., stacked finFET structures) or forksheet devices. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of diffusion cut structures that include compressive and/or tensile stressor materials adjacent to stacked semiconductor devices. In some examples, only a compressive stressor material is present along a bottom or top row of stacked devices. In some examples, only a tensile stressor material is present along a bottom or top row of stacked devices. Material analysis may be used to indicate the presence of compressive and/or tensile stressor materials and to distinguish between stacked compressive and tensile stressor materials.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view of a portion of an integrated circuit that includes a first semiconductor device 101 and a second semiconductor device 103, where second semiconductor device 103 is stacked vertically over first semiconductor device 101, according to an embodiment of the present disclosure. The cross-section view is taken lengthwise (perpendicular to the gate structure) across first semiconductor device 101 and second semiconductor device 103 in a first direction while the devices are vertically stacked over one another in a second direction substantially orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of the integrated circuit that may contain any number of similar semiconductor devices. While other semiconductor devices may be illustrated, such as semiconductor devices 105, 107, 109, and 111 in FIGS. 1B and 1C, reference herein is made primarily to the structures of semiconductor devices 101 and 103 for ease of discussion. The description of such structures may apply equally to the corresponding structures of other semiconductor devices in the integrated circuit.

As can be seen, integrated circuit 100 is formed over a dielectric base layer 102. According to some embodiments, dielectric base layer 102 is formed after the removal of a substrate during backside processing, as will be described in more detail herein. Dielectric base layer 102 may be any suitable dielectric material, such as silicon dioxide, aluminum oxide, or silicon oxycarbonitride. In some embodiments, dielectric base layer 102 includes any number of backside interconnect layers.

First semiconductor device 101 may include any number of semiconductor nanoribbons 104 extending between a first source or drain region 106*a* and a second source or drain region 106*b*. In some examples, first source or drain region 106*a* and second source or drain region 106*b* represent epitaxial material grown from the ends of each of semiconductor nanoribbons 104 that may or may not merge together along the side of the device. Additional semiconductor material or conductive material may be grown or otherwise deposited over the epitaxially grown material to complete the formation of first source or drain region 106*a* and second source or drain region 106*b*. In some embodiments, first source or drain region 106*a* and second source or drain region 106*b* include silicon, germanium, and boron as part of a p-channel semiconductor device.

Second semiconductor device 103 may include any number of semiconductor nanoribbons 108 extending between a third source or drain region 110*a* and a fourth source or drain region 110*b*. In some examples, third source or drain region 110*a* and fourth source or drain region 110*b* represent epitaxial material grown from the ends of each of semiconductor nanoribbons 108 that may or may not merge together along the side of the device. Additional semiconductor material or conductive material may be grown or otherwise deposited over the epitaxially grown material to complete the formation of third source or drain region 110*a* and fourth source or drain region 110*b*. In some embodiments, third source or drain region 110*a* and fourth source or drain region 110*b* include silicon and phosphorous as part of a n-channel semiconductor device. Due to the stacked arrangement of the devices, third source or drain region 110*a* is formed over first source or drain region 106*a* in the second direction while fourth source or drain region 110*b* is formed over second source or drain region 106*b* in the second direction, according to some embodiments.

Any of the source or drain regions may act as either a source region or a drain region, depending on the application and dopant profile. In some embodiments, semiconductor devices 101 and 103 have an equal number of nanoribbons, while in other embodiments they have an unequal number of nanoribbons. In some embodiments, each of nanoribbons 104 and nanoribbons 108 are formed from a fin of alternating material layers (e.g., alternating layers of silicon and silicon germanium) where sacrificial material layers are removed between nanoribbons 104 and nanoribbons 108. Each of nanoribbons 104 and nanoribbons 108 may include the same semiconductor material. In any such cases, and according to some embodiments, a vertical distance between about 10 nm and about 80 nm or between about 30 nm and about 80 nm separates the nanoribbons 104 of first semiconductor device 101 from the nanoribbons 108 of second semiconductor device 103. Other embodiments may have a smaller or larger such vertical distance.

Any semiconductor materials suitable for source and drain regions can be used (e.g., group IV and group III-V semiconductor materials) for any of the illustrated source or drains regions. In any such cases, the composition and doping of the source and drain regions may be the same or different, depending on the polarity of the transistors. In an example, first semiconductor device 101 is a p-type MOS (PMOS) transistor having a high concentration of p-type dopants in first source or drain region 106*a* and second source or drain region 106*b*, and second semiconductor device 103 is an n-type MOS (NMOS) transistor having a high concentration of n-type dopants in third source or drain region 110*a* and fourth source or drain region 110*b*. Any number of source and drain configurations and materials can be used.

A gate structure 112 is provided over each of nanoribbons 104 and nanoribbons 108 in a shared gate architecture, according to some embodiments. In some other embodiments, a dielectric layer is present between nanoribbons 104 and nanoribbons 108 to produce a split gate architecture where a first gate structure around nanoribbons 104 is electrically isolated from a second gate structure around nanoribbons 108. The embodiments illustrated herein use the shared gate architecture but are equally applicable to split gate architectures.

Spacer structures 114*a* and 114*b* are included on either side of gate structure 112. Spacer structures 114*a* and 114*b* may include a dielectric material, such as silicon nitride, silicon oxynitride, or silicon oxycarbonitride. Gate structure 112 includes both a gate dielectric around each of nanoribbons 104 and nanoribbons 108 and a gate electrode over the gate dielectric. The gate dielectric may include a single material layer or multiple material layers. In some embodiments, the gate dielectric includes a first dielectric layer such as an oxide native to nanoribbons 104 and 108 (e.g., silicon oxide) and a second dielectric layer that includes a high-k material (e.g., such as hafnium oxide). The high-k dielectric material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide). In some embodiments, the gate dielectric around nanoribbons 104 has a different element doping concentration compared to the gate dielectric around nanoribbons 108. According to some embodiments, the doping element used in the gate dielectric is lanthanum or aluminum.

According to some embodiments, the gate electrode extends over the gate dielectric around each of nanoribbons 104 and nanoribbons 108 and also generally fills the remaining space between the various nanoribbons of any number of stacked semiconductor devices. The gate electrode may include any number of sufficiently conductive materials such as any metals, metal alloys, or doped polysilicon. In some embodiments, the gate electrode includes one or more different work function metals around nanoribbons 104 and 108. In some embodiments, semiconductor device 101 is a p-channel device that includes a work function metal having titanium around nanoribbons 104 and semiconductor device 103 is an n-channel device that includes a work function metal having tungsten around nanoribbons 108. The gate electrode may also include a fill metal or other conductive material around the work function metals to provide the whole gate electrode structure. According to some embodiments, the gate structure may be interrupted between any adjacent semiconductor devices in a third direction (e.g., running into and out of the page) orthogonal to both the first and second directions by a gate cut structure.

According to some embodiments, a dielectric layer 116 may be present between first source or drain region 106*a* and third source or drain region 110*a* and between second source or drain region 106*b* and fourth source or drain region 110*b* in the second direction to isolate the regions from one another. Dielectric layer 116 may be any suitable dielectric material, such as silicon oxide, silicon oxynitride, or silicon oxycarbonitride. Dielectric layer 116 may have a thickness between about 10 nm and about 30 nm.

According to some embodiments, lower dielectric layer 118 may be provided adjacent to backside contacts 120. Lower dielectric layer 118 may be any suitable dielectric material, such as silicon oxide, silicon oxynitride, or silicon oxycarbonitride. In some embodiments, lower dielectric layer 118 and dielectric base layer 102 are the same material and are formed together. Backside contacts 120 may include any conductive material such as copper (Cu), ruthenium (Ru), tungsten (W), cobalt (Co), titanium (Ti), molybdenum (Mo), or any alloys thereof. In some embodiments, backside contacts 120 includes one or more layers of different conductive materials, such as a liner that includes titanium silicide, tantalum silicide, titanium germanide, tantalum germanide, nitrogen germanide, or nitrogen silicide and a fill material that includes tungsten, ruthenium, molybdenum, or cobalt, to name a few examples. According to some embodiments, backside contacts 120 provide electrical connections to first source or drain region 106*a* and second source or drain region 106*b*. Similarly, topside contacts 122 provide electrical connections to third source or drain region 110*a* and fourth source or drain region 110*b*. Topside contacts 122 may include any of the materials described above for backside contacts 120.

According to some embodiments, first source or drain region 106*a* and third source or drain region 110*a* are formed between spacer structure 114*a* and another spacer structure 123*a* that runs parallel to spacer structure 114*a*. Similarly, third source or drain region 106*b* and fourth source or drain region 110*b* are formed between spacer structure 114*b* and another spacer structure 123*b* that runs parallel to spacer structure 114*b*. According to some embodiments, stressor materials are formed on the opposite sides of spacer structures 123*a* and 123*b* to provide compressive or tensile stress to semiconductor devices 101 and 103. In an example case where semiconductor device 101 is a p-channel device, stressor structures 124*a* and 124*b* may be compressive stressors formed adjacent to spacer structures 123*a* and 123*b*, such that a portion of spacer structure 123*a* is between stressor structure 124*a* and first source or drain region 106*a* and a portion of spacer structure 123*b* is between stressor structure 124*b* and second source or drain region 106*b*. Additional stressor structures 126*a* and 126*b* may be formed over stressor structures 124*a* and 124*b*, respectively. In an example case where semiconductor device 103 is a n-channel device, stressor structures 126*a* and 126*b* may be tensile stressors formed adjacent to spacer structures 123*a* and 123*b*, such that a portion of spacer structure 123*a* is between stressor structure 126*a* and third source or drain region 110*a* and a portion of spacer structure 123*b* is between stressor structure 126*b* and fourth source or drain region 110*b*. The material of the stressor structures may be chosen to assert a tensile or compressive stress depending on whether semiconductor devices 101 and 103 are n-channel or p-channel devices. As discussed above, example compressive stressor materials include silicon nitride (SiN), helium implanted oxide, or various metal oxides, nitrides and carbides (e.g., TiAlN, TiO, TiAlC, TiSiO, AlO, AlN), to name a few examples. Example tensile stressor materials include curable reflowable silicon oxide. The stressor structures may include a liner on a fill material. In some embodiments, stressor structures 124*a* and 126*a* include a same material (either compressive or tensile) and stressor structures 124*b* and 126*b* include a same material (either compressive or tensile). In such examples, stressor structures 124*a* and 126*a* may represent a column or trench of compressive or tensile material while stressor structures 124*b* and 126*b* may represent a column or trench of compressive or tensile material.

According to some embodiments, nubs of semiconductor material 128 may be present within each of spacer structures 123*a* and 123*b*. These nubs may be remnants of semiconductor nanoribbons or nanosheets that were removed during the formation of the various stress structures, as will be described in more detail herein. Accordingly, nubs of semiconductor material 128 may align along the same horizontal planes as nanoribbons 104 and 108.

Figure 1B:
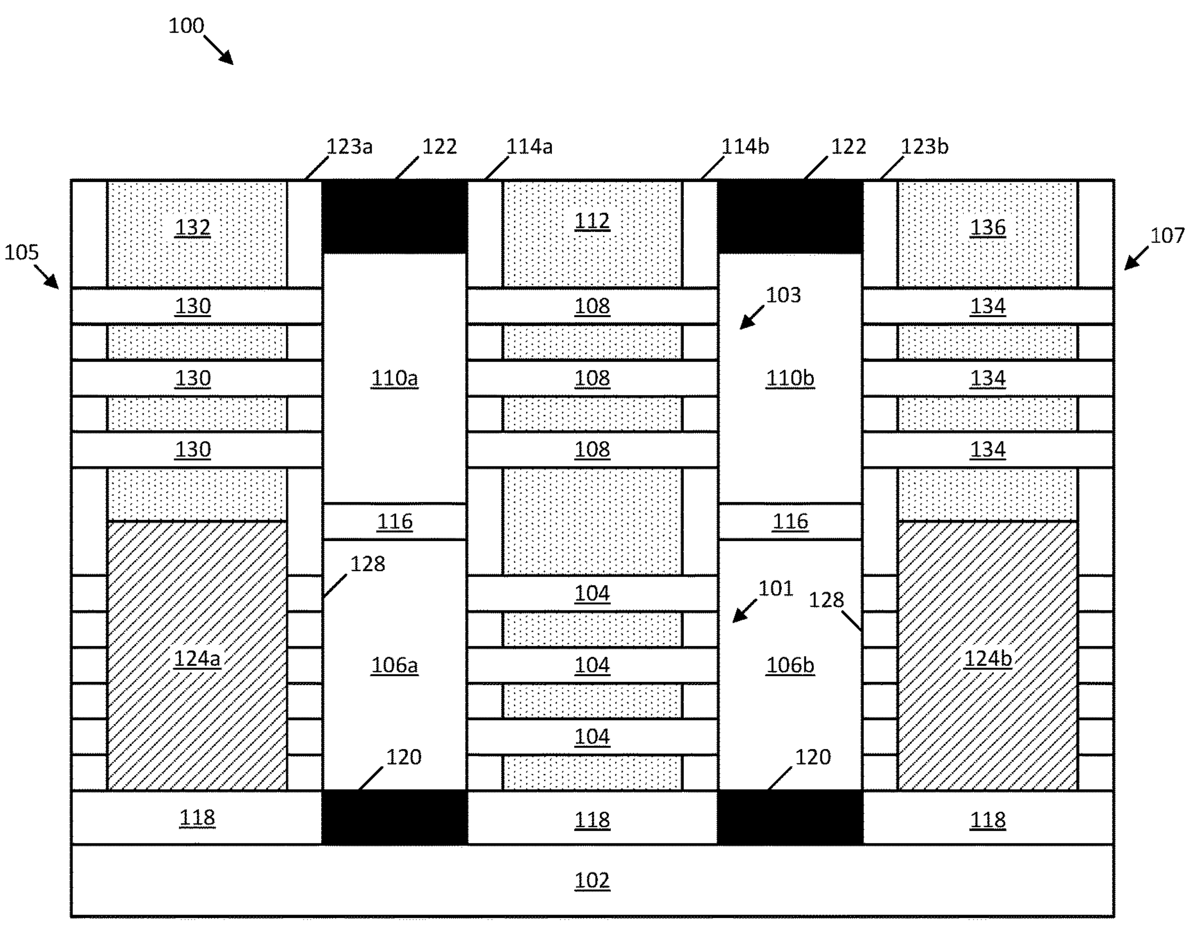
FIG. 1B is a cross-sectional view of an example integrated circuit having stacked semiconductor devices with the lower device adjacent to a compressive or tensile stressor material, in accordance with an embodiment of the present disclosure.

FIG. 1B is a cross sectional view of another portion of an integrated circuit that includes first semiconductor device 101 and second semiconductor device 103 along with stressor structures adjacent only to first semiconductor device 101 (and not second semiconductor device 103), according to some embodiments. All of the above discussion related to stressor structures 124*a* and 124*b* applies here as well.

According to some embodiments, additional semiconductor devices 105 and 107 are formed instead of a stressor material above stressor structures 124*a* and 124*b*, respectively. Accordingly, semiconductor device 105 includes a plurality of nanoribbons 130 extending between third source or drain region 110*a* and another source or drain region (not illustrated), while semiconductor device 107 includes a plurality of nanoribbons 134 extending between fourth source or drain region 110*b* and another source or drain region (not illustrated). A gate structure 132 is formed around nanoribbons 130 while another gate structure 136 is formed around nanoribbons 134. According to some embodiments, each of semiconductor devices 103, 105, and 107 along the same row are n-channel devices.

Figure 1C:
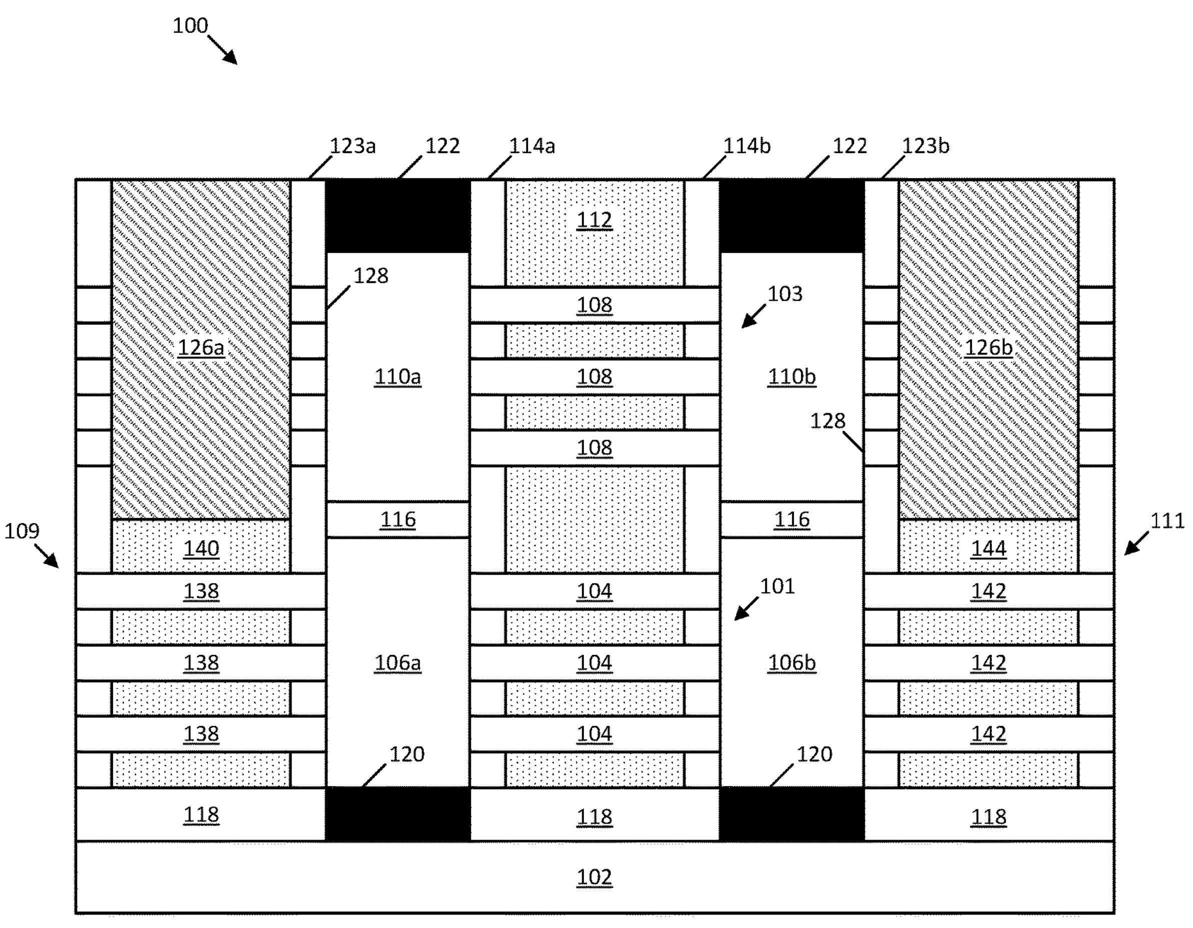
FIG. 1C is a cross-sectional view of an example integrated circuit having stacked semiconductor devices with the upper device adjacent to a compressive or tensile stressor material, in accordance with an embodiment of the present disclosure.

FIG. 1C is a cross sectional view of another portion of an integrated circuit that includes first semiconductor device 101 and second semiconductor device 103 along with stressor structures adjacent only to second semiconductor device 103 (and not first semiconductor device 101), according to some embodiments. All of the above discussion related to stressor structures 126*a* and 126*b* applies here as well.

According to some embodiments, additional semiconductor devices 109 and 111 are formed instead of a stressor material below stressor structures 126*a* and 126*b*, respectively. Accordingly, semiconductor device 109 includes a plurality of nanoribbons 138 extending between first source or drain region 106*a* and another source or drain region (not illustrated), while semiconductor device 111 includes a plurality of nanoribbons 142 extending between second source or drain region 106*b* and another source or drain region (not illustrated). A gate structure 140 is formed around nanoribbons 138 while another gate structure 144 is formed around nanoribbons 142. According to some embodiments, each of semiconductor devices 101, 109, and 111 along the same row are p-channel devices.

Fabrication Methodology

Figure 2A:
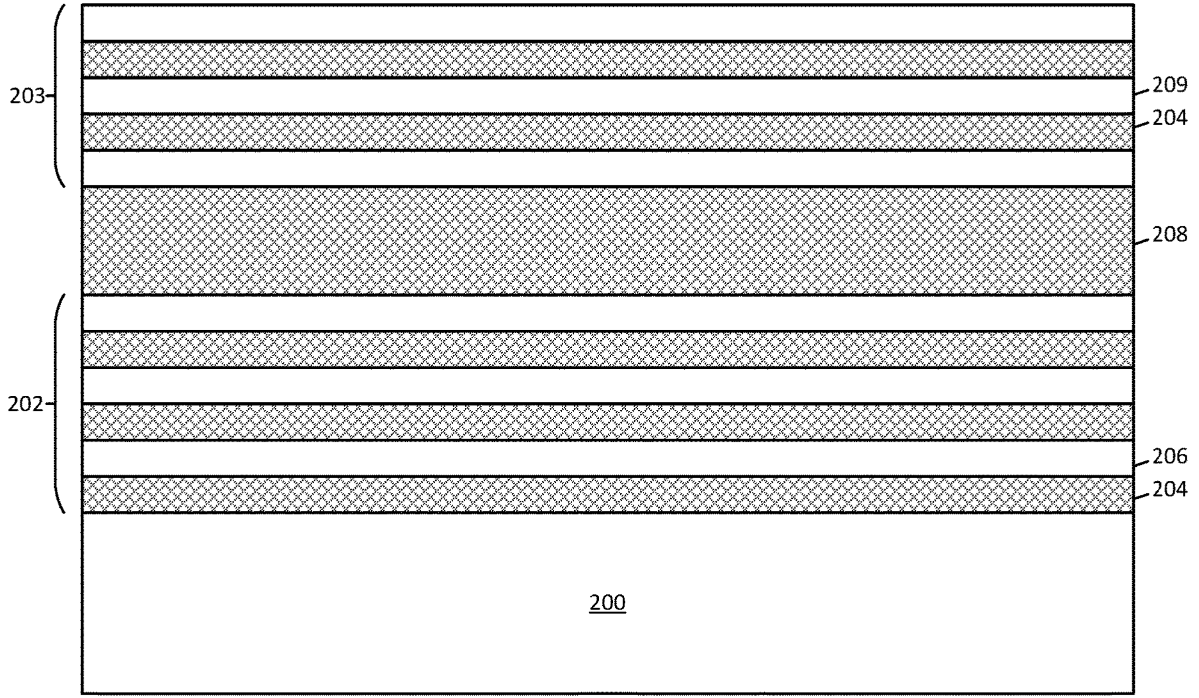
FIGS. 2A-2N are cross-sectional views that collectively illustrate an example process for forming stacked semiconductor devices adjacent to respective diffusion cut structures that include diverse stressor materials (e.g., compressive stressor material in lower diffusion cut structures, and tensile stressor material in upper diffusion cut structures), in accordance with some embodiments of the present disclosure.
Figure 2B:
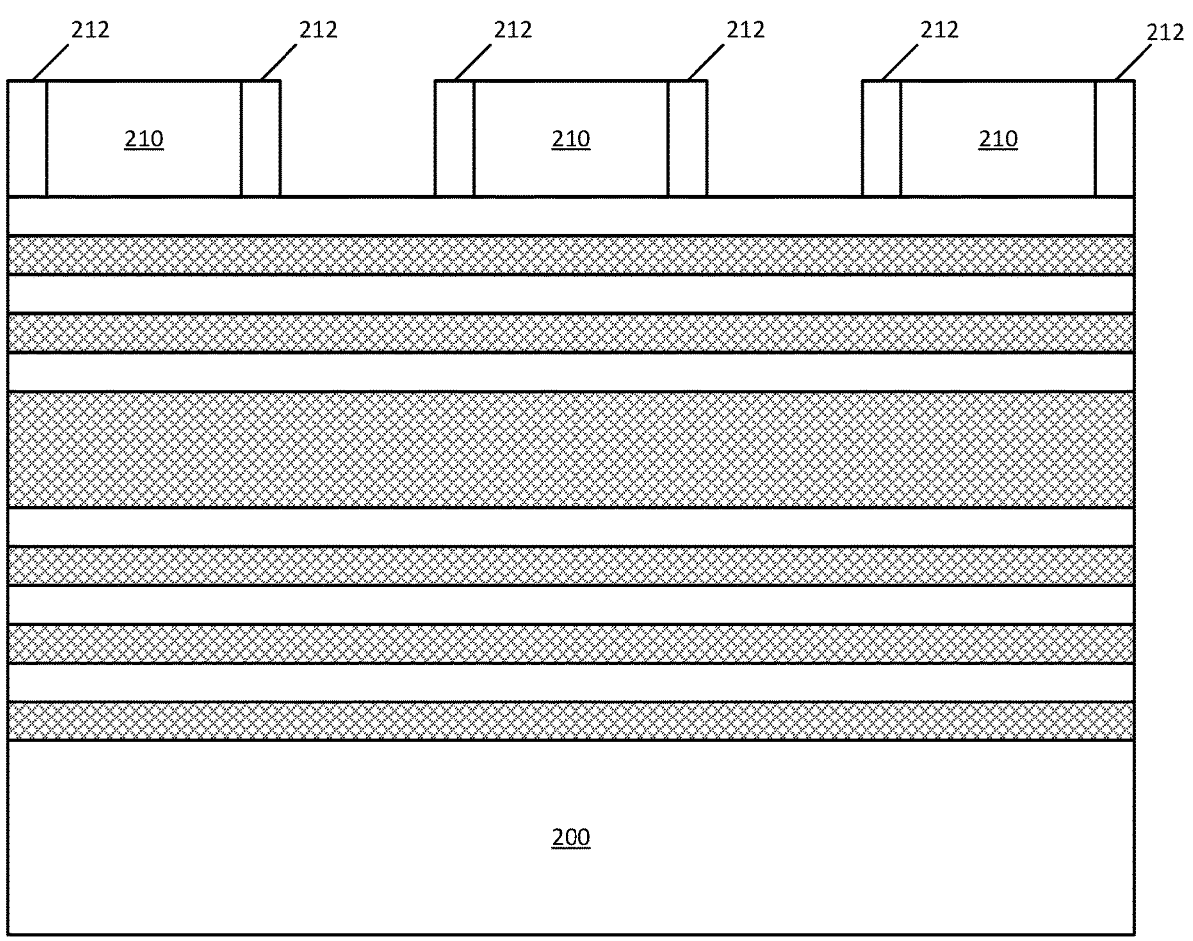
Figure 2C:
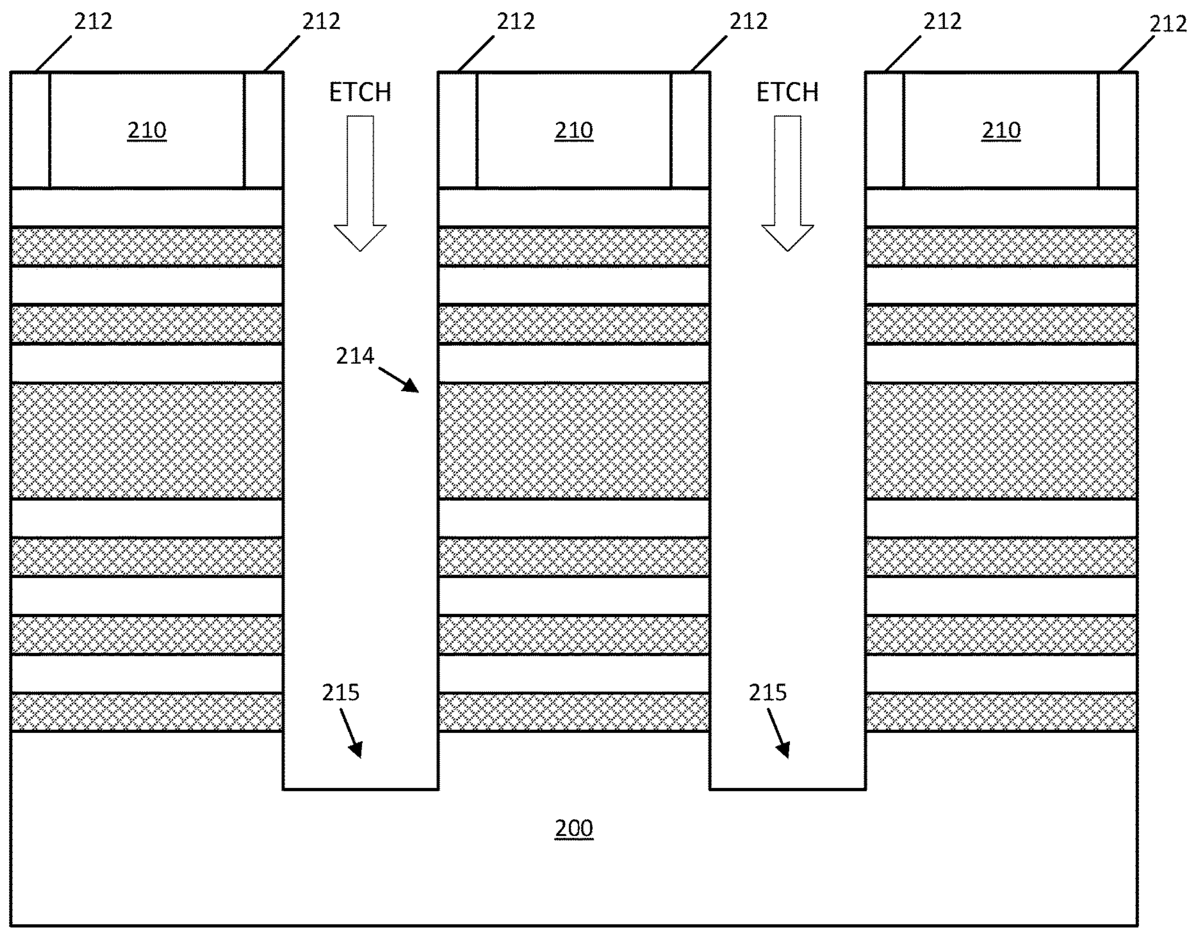
Figure 2D:
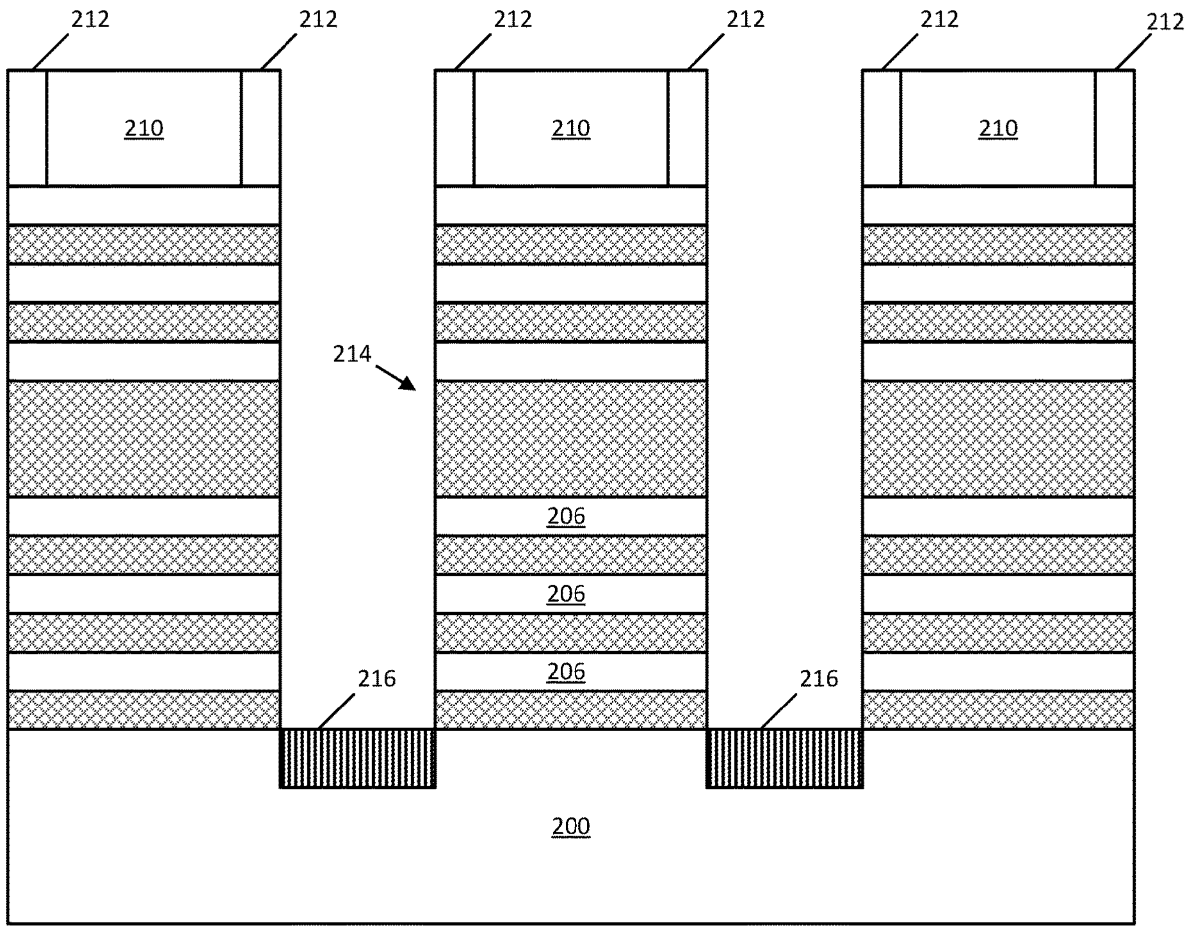
Figure 2E:
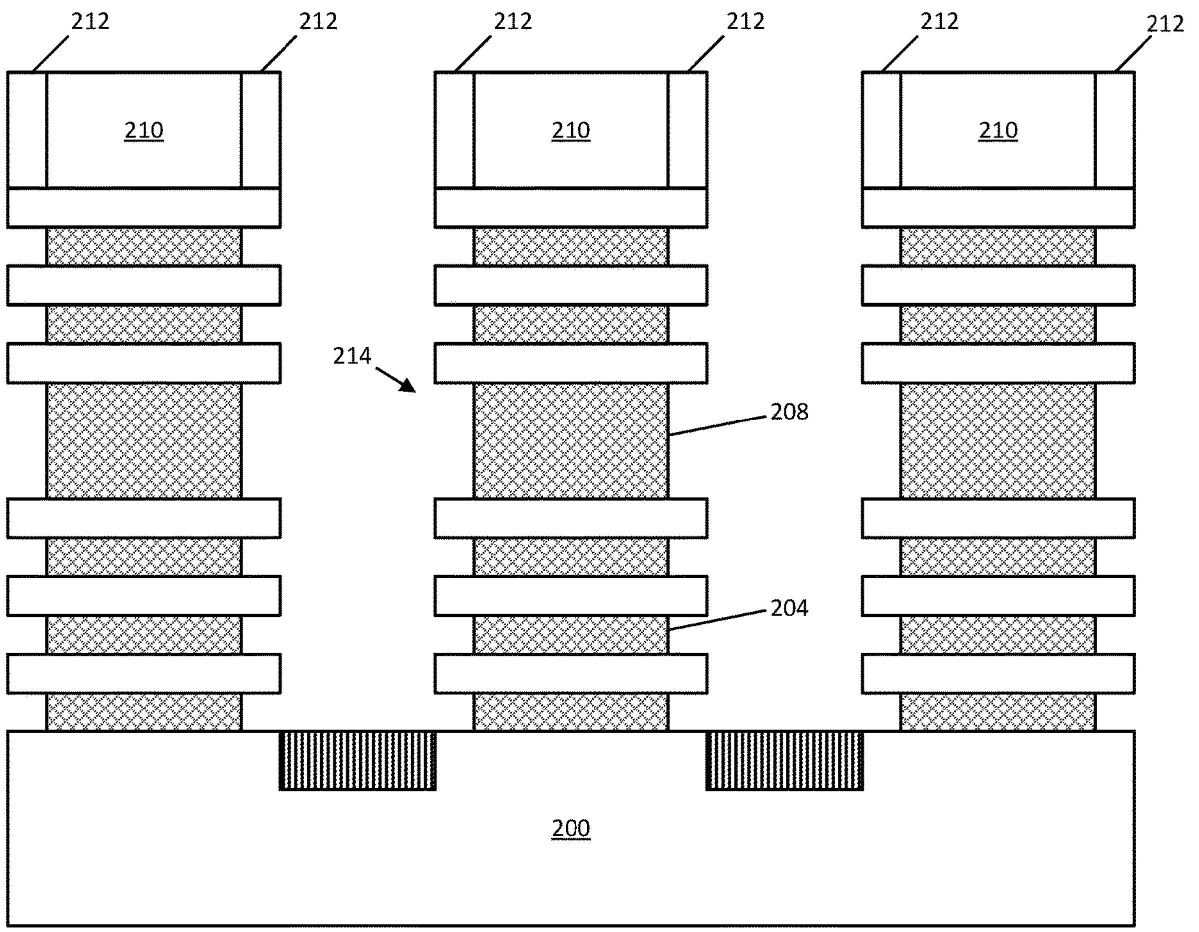
Figure 2F:
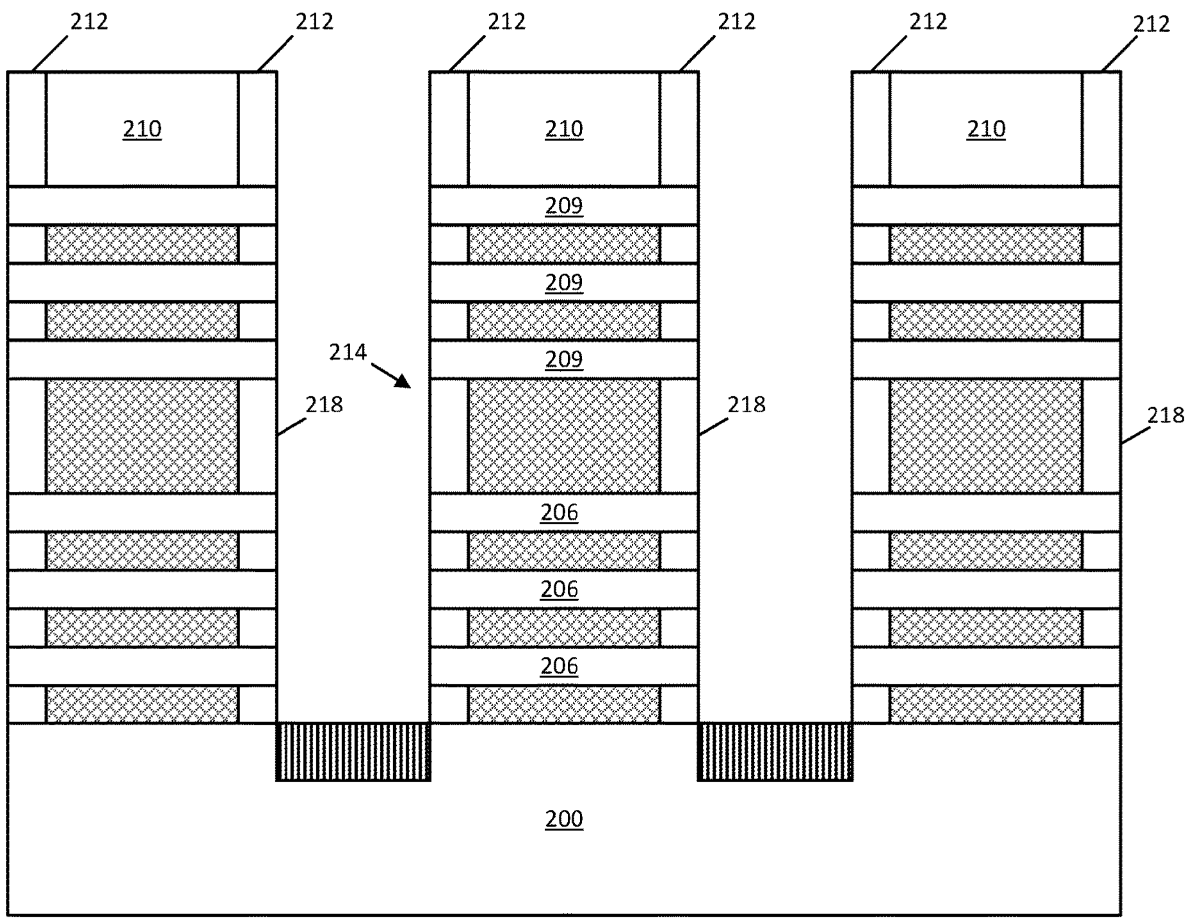
Figure 2G:
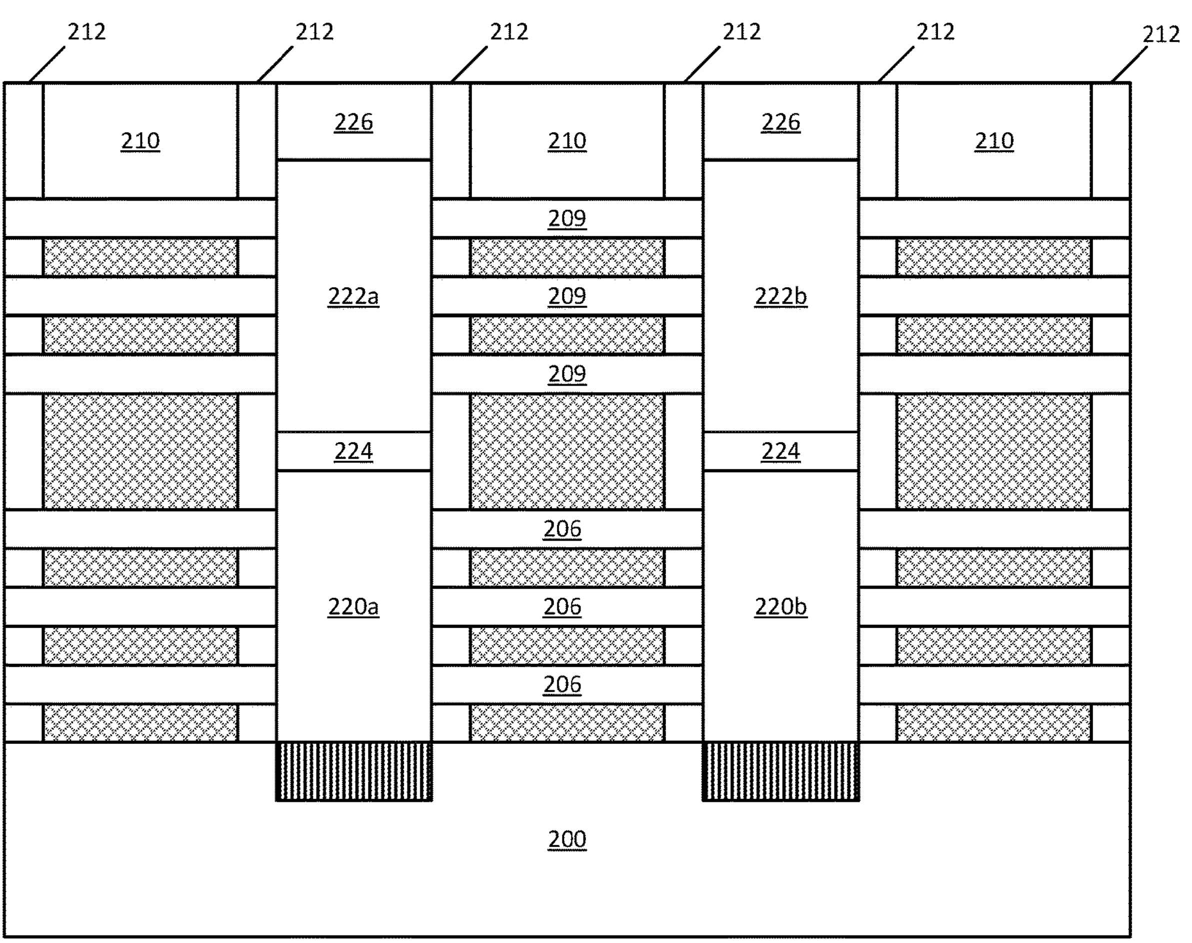
Figure 2H:
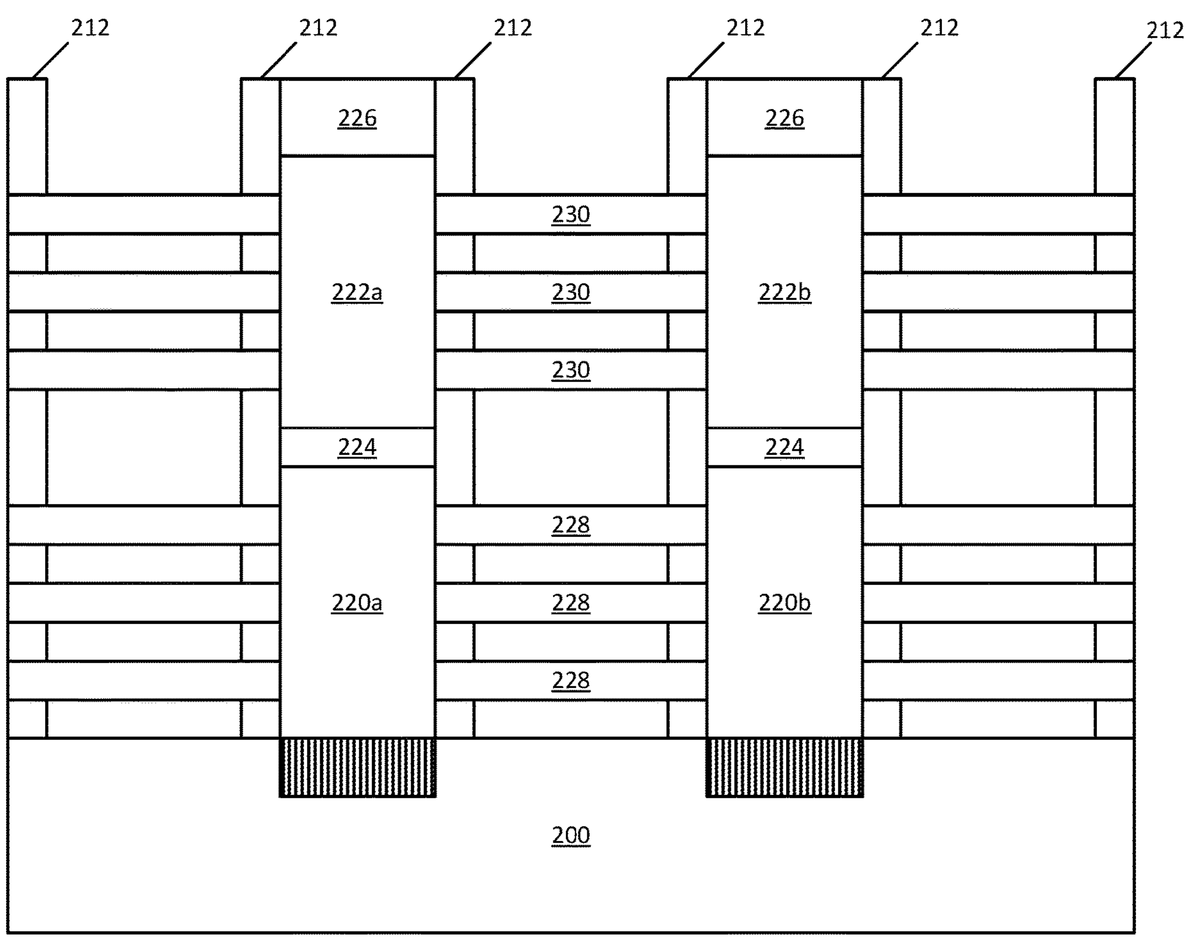
Figure 2I:
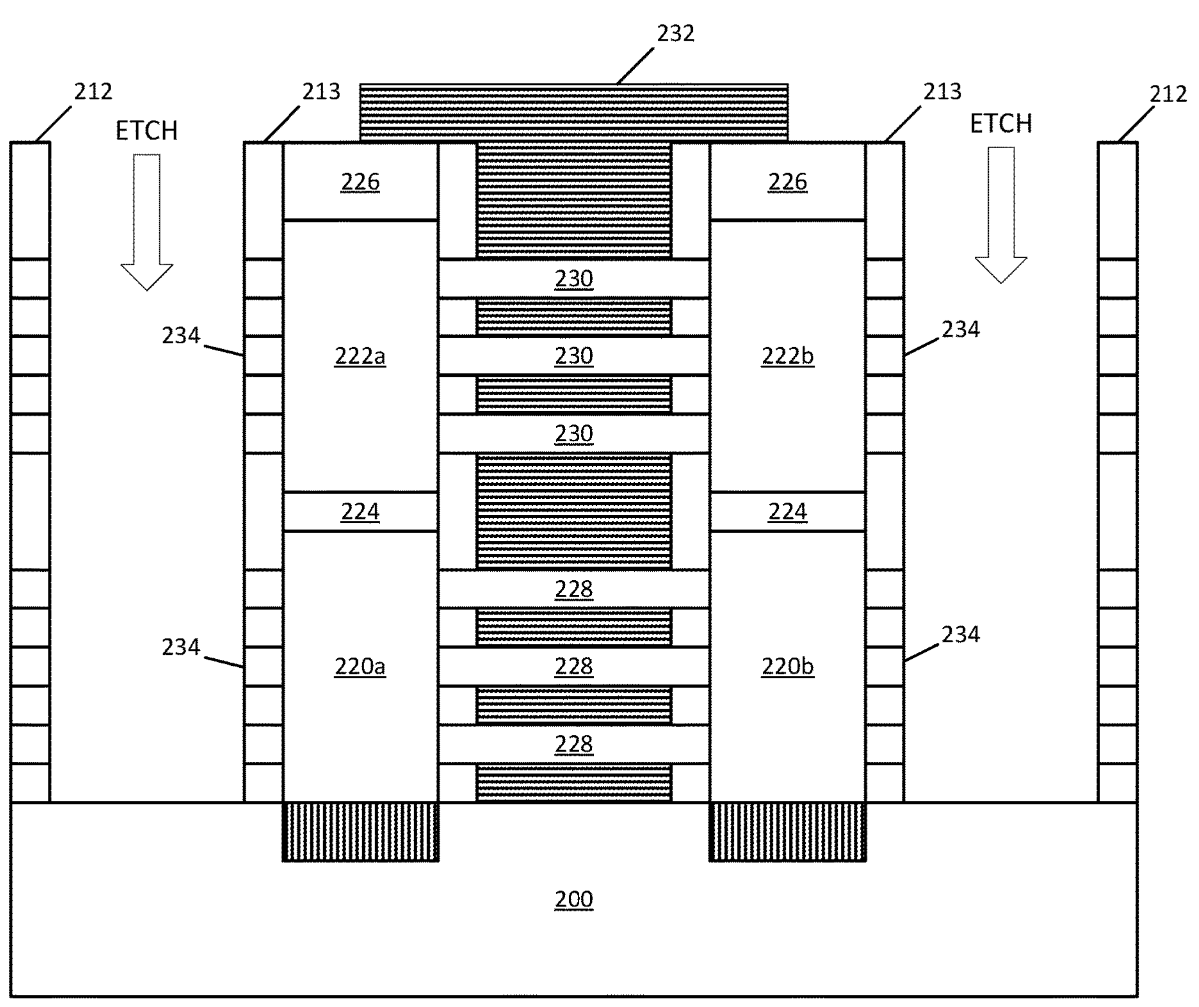
Figure 2J:
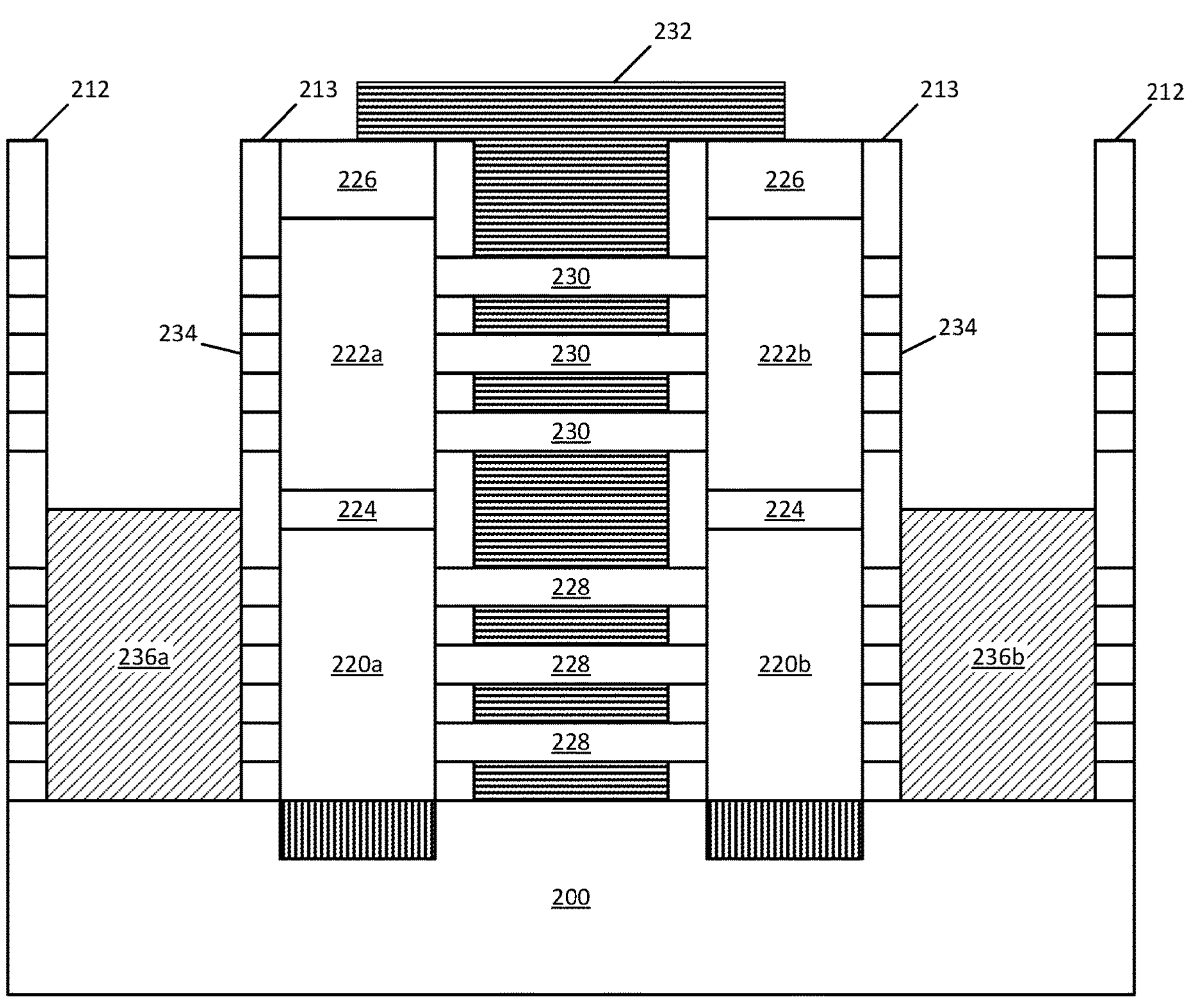
Figure 2K:
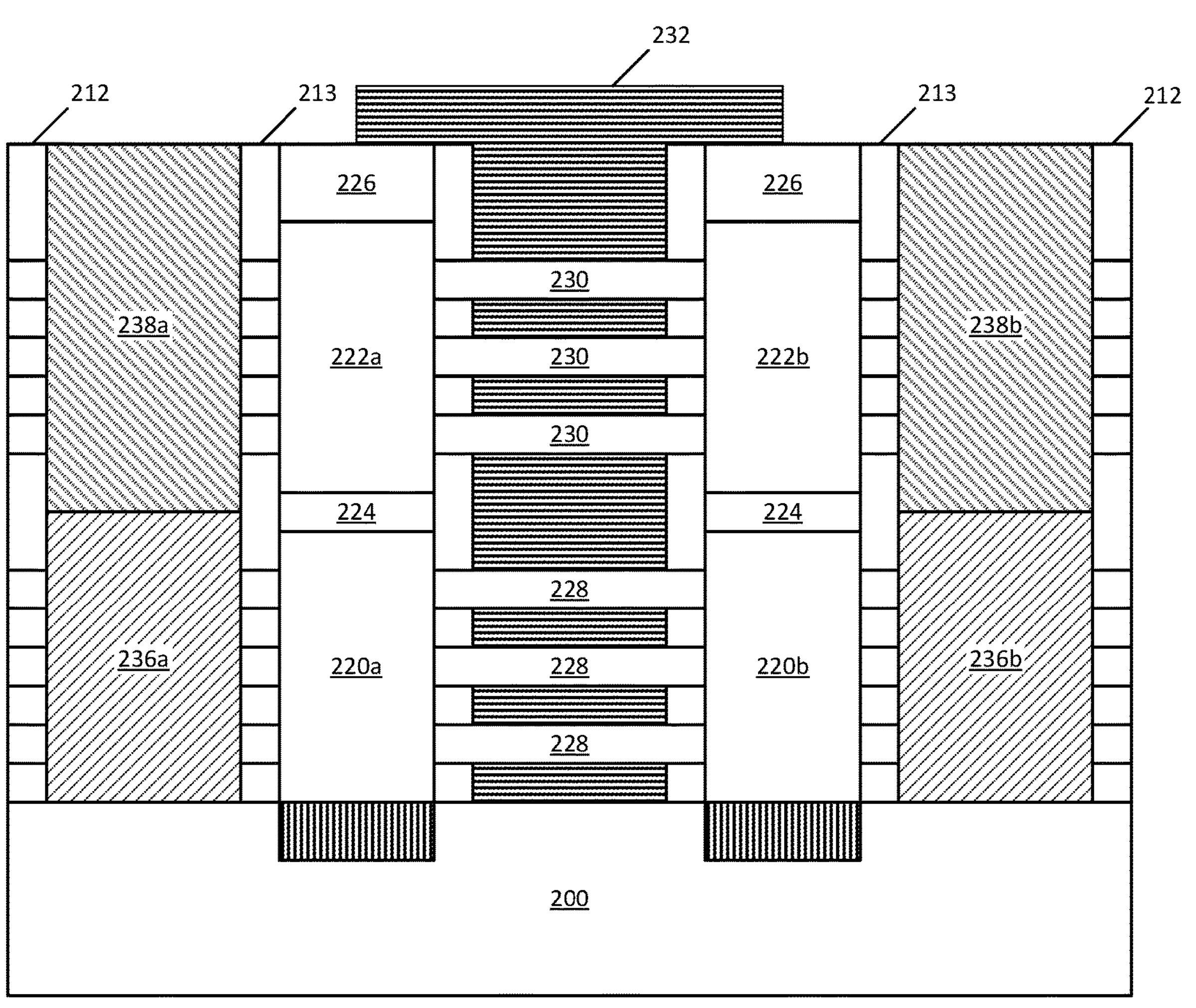
Figure 2L:
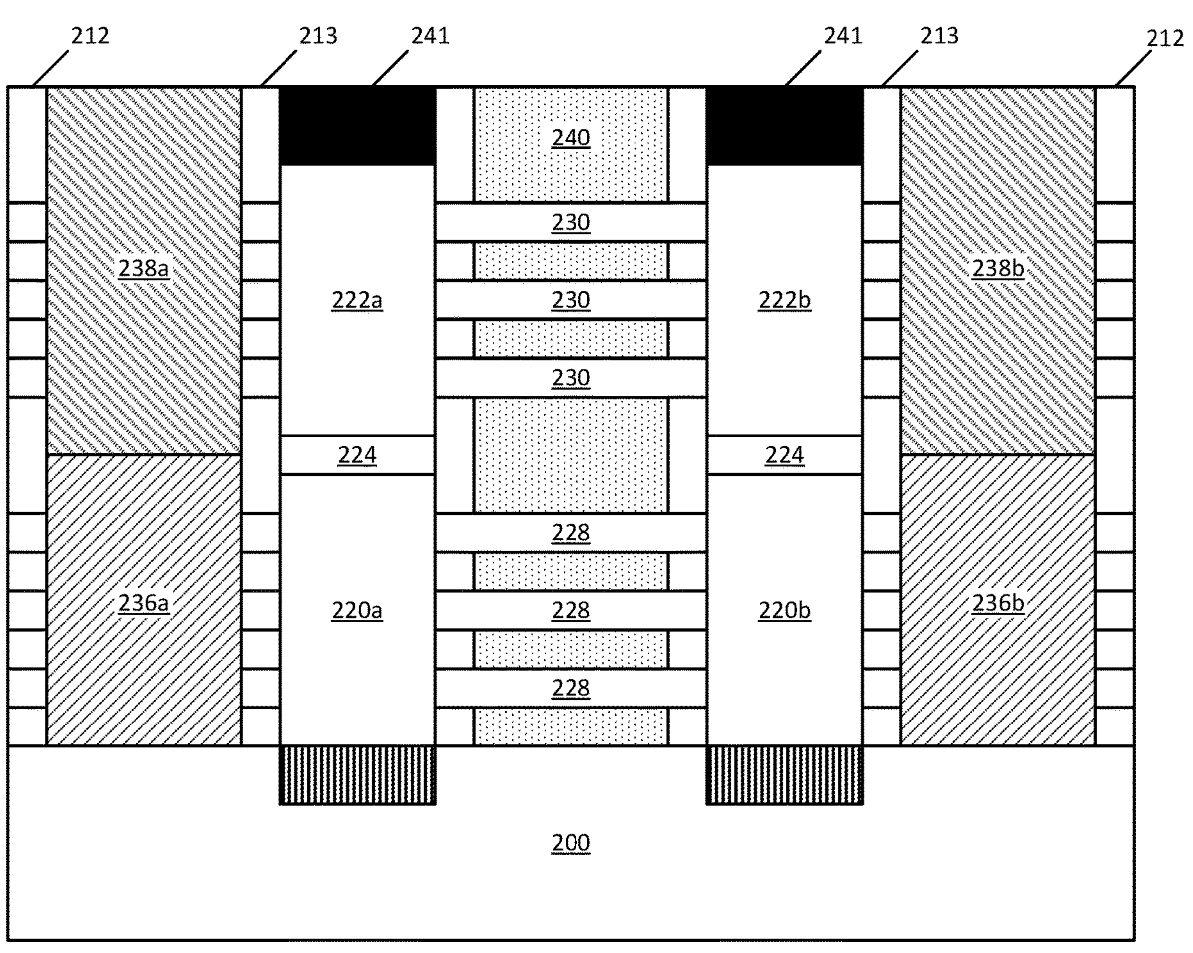
Figure 2M:
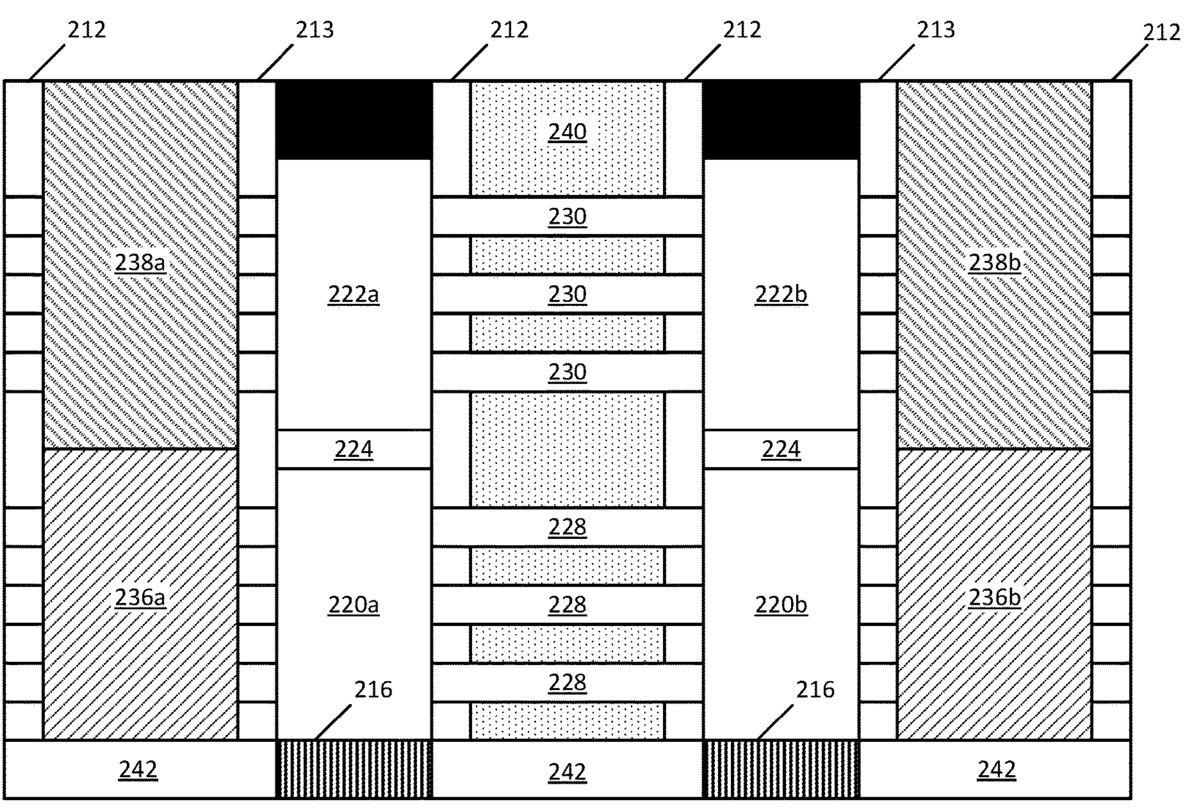
Figure 2N:
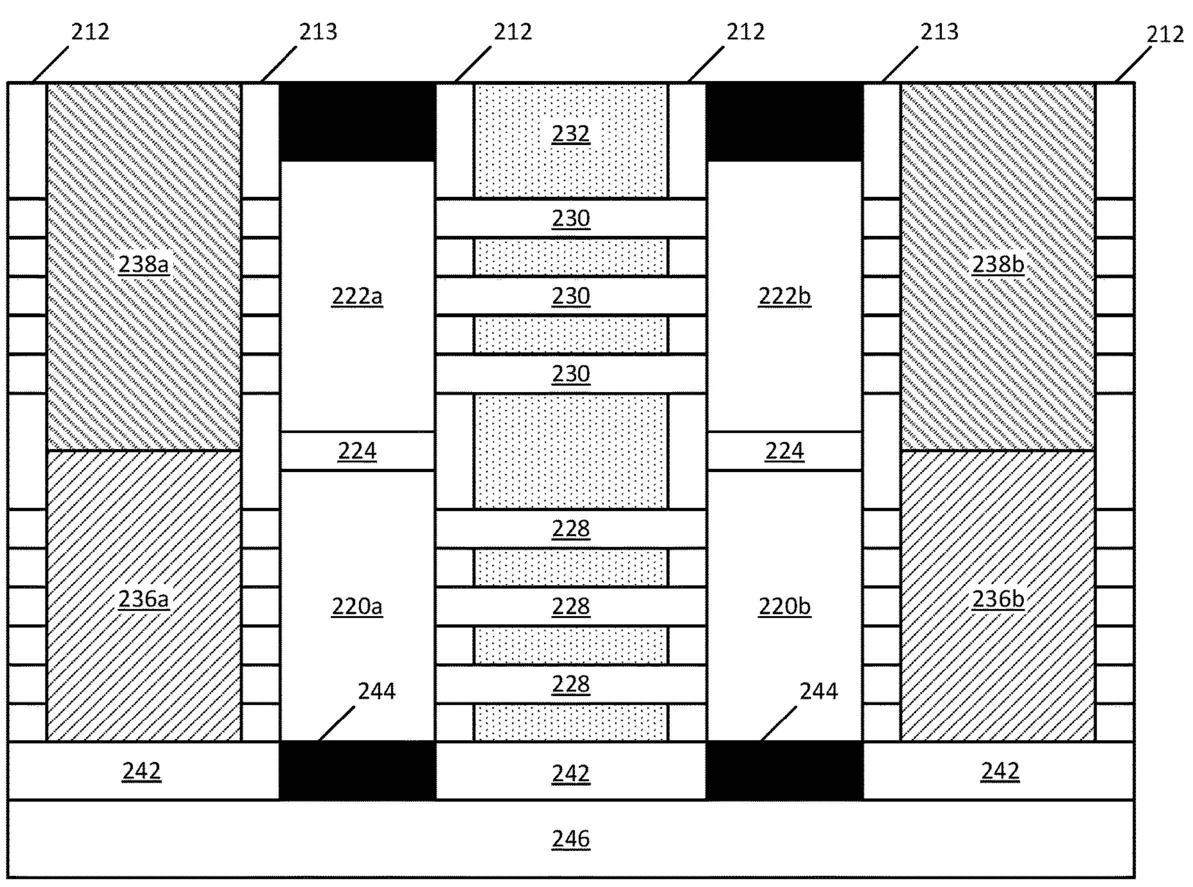

FIGS. 2A-2N include cross-sectional views that collectively illustrate an example process for forming an integrated circuit configured with stacked semiconductor devices having both compressive and tensile stressor structures. Each figure shows an example structure that results from the process flow up to that point in time, so the depicted structure evolves as the process flow continues, culminating in the structure shown in FIG. 2N, which is similar to the structure illustrated in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 2A illustrates a cross-sectional view across a substrate 200 having a series of material layers deposited over it, according to an embodiment of the present disclosure. Substrate 200 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 200 can be a semiconductor-on-insulator substrate having a desired semiconductor layer over a buried insulator layer (e.g., silicon over silicon dioxide). Alternatively, substrate 200 can be a multilayer substrate or superlattice suitable for forming nanowires or nanoribbons (e.g., alternating layers of silicon and SiGe, or alternating layers indium gallium arsenide and indium phosphide). Any number of substrates can be used.

Alternating material layers may be deposited over substrate 200, including a first layer stack 202, a second layer stack 203, and a second spacer layer 208 between first layer stack 202 and second layer stack 203. Each of first and second layer stacks 202 and 203 includes sacrificial layers 204 alternating with other material layers, such as first semiconductor layers 206 of first layer stack 202 and second semiconductor layers 209 of second layer stack 203. Any number of alternating sacrificial layers 204 and material layers may be deposited within each of first layer stack 202 and second layer stack 203. Additionally, any number of layer stacks and spacer layers may be deposited over substrate 200. It should be noted that the cross section illustrated in FIG. 2A is taken along the length of a fin formed from the multiple alternating layers and extending up above the surface of substrate 200.

According to some embodiments, sacrificial layers 204 have a different material composition than each of first semiconductor layers 206 and second semiconductor layers 209. In some embodiments, sacrificial layers 204 are silicon germanium (SiGe) while each of first semiconductor layers 206 and second semiconductor layers 209 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 204 and first and second semiconductor layers 206 and 209, the germanium concentration is different between sacrificial layers 204 and first and second semiconductor layers 206 and 209. For example, sacrificial layers 204 may include a higher germanium content compared to first and second semiconductor layers 206 and 209. Spacer layer 208 may include the same material as sacrificial layers 204. In some other embodiments, spacer layer 208 includes a dielectric material or may be a bonding oxide material. In some examples, spacer layer 208 can be any material that exhibits a high etch selectivity with the material of semiconductor layers 206 and 209.

While dimensions can vary from one example embodiment to the next, the thickness of each sacrificial layer 204 may be between about 5 nm and about 20 nm. In some embodiments, the thickness of each sacrificial layer 204 is substantially the same (e.g., within 1-2 nm) across each of first layer stack 202 and second layer stack 203. The thickness of each of first semiconductor layers 206 and second semiconductor layers 209 may be about the same as the thickness of each sacrificial layer 204 (e.g., about 5-20 nm). However, according to some embodiments, the thickness of spacer layer 208 is thicker than any of sacrificial layers 204. Spacer layer 208 may be provided to create a sufficient spacing between the adjacent semiconductor devices to be formed from first semiconductor layers 206 and second semiconductor layers 209. While dimensions can vary from one example embodiment to the next, the thickness of spacer layer 208 may be between about 10 nm to about 80 nm. Each of sacrificial layers 204, first semiconductor layers 206, second semiconductor layers 209, and spacer layer 208 may be deposited using any known material deposition technique, such as chemical vapor deposition (CVD), plasma-enhanced chemical vapor deposition (PECVD), physical vapor deposition (PVD), or atomic layer deposition (ALD).

FIG. 2B illustrates a cross-sectional view of the structure shown in FIG. 2A following the formation of a sacrificial gate structures 210 and sidewall spacers 212 over the alternating layer structure of the fin, according to an embodiment. Sacrificial gate structures 210 may run in an orthogonal direction to the length of the fin and may include any material that can be safely removed later in the process without etching or otherwise damaging any portions of the fin or of spacer structures 212. In some embodiments, sacrificial gate structures 210 include polysilicon. Spacer structures 212 may be formed using an etch-back process where spacer material is deposited everywhere and then anisotropically etched to leave the material only on sidewalls of structures including sacrificial gate structures 210. Spacer structures 212 may include a dielectric material, such as silicon nitride, silicon oxy-nitride, or any formulation of those layers incorporating carbon or boron dopants. Each sacrificial gate structure 210 together with its associated spacer structures 212 define a portion of the fin that will be used to form suspended semiconductor nanoribbons as discussed further herein.

FIG. 2C illustrates a cross-sectional view of the structure shown in FIG. 2B following the removal of the exposed fin not under sacrificial gate structures 210 and sidewall spacers 212, according to an embodiment of the present disclosure. According to some embodiments, the various layers of the different layer stacks are etched at substantially the same rate using an anisotropic RIE process. According to some embodiments, the RIE process also etches through a portion of substrate 200 thus forming a recess 215 within substrate 200 adjacent to the fins. As observed in FIG. 2C, the width of spacer structures 212 works to define the length of the resulting fins, such as fin 214. In some embodiments, some undercutting occurs along the edges of the fins beneath spacer structures 212 such that the lengths of the fins are not exactly the same as a sum of the widths of spacer structures 212 and a width of a given sacrificial gate structure 210. The discussion of the fin fabrication process herein will focus on fin 214 though the same processes may be occurring with any of the other fins.

FIG. 2D illustrates a cross-sectional view of the structure shown in FIG. 2C following the formation of a sacrificial plug 216 within recess 215, according to an embodiment of the present disclosure. Sacrificial plug 216 may include any material that has a high degree of etch selectivity with the semiconductor material of substrate 200. In some examples, sacrificial plug 216 includes titanium nitride (TiN), titanium oxide ($TiO_2$), silicon nitride (SiN), silicon carbide (SiC), or silicon carbonitride (SiCN). According to some embodiments, sacrificial plug 216 is recessed to a given thickness such that a top surface of sacrificial plug 216 is at least beneath a bottom-most semiconductor layer of first semiconductor layers 206.

FIG. 2E illustrates a cross-sectional view of the structure shown in FIG. 2D following the removal of portions of sacrificial layers 204, according to an embodiment of the present disclosure. An isotropic etching process may be used to recess the exposed ends of each sacrificial layer 204 along the entire layer stack of fin 214. Spacer layer 208 may be recessed as well along with each sacrificial layer 204. The isotropic etchant used exhibits a high etch selectivity between sacrificial layers 204 and each of the semiconductor layers.

FIG. 2F illustrates a cross-sectional view of the structure shown in FIG. 2E following the formation of internal spacers 218, according to an embodiment of the present disclosure. Internal spacers 218 may have a material composition that is similar to or the exact same as spacer structures 212. Accordingly, internal spacers 218 may be any suitable dielectric material that exhibits high etch selectively to semiconductor materials such as silicon and/or silicon germanium. In some embodiments, internal spacers 218 include multiple deposited layers, such as a liner followed by a fill material. Internal spacers 218 may be conformally deposited over the sides of the fin structure using a CVD process like ALD. After the dielectric material has been deposited, an isotropic etching process is performed to remove internal spacers 218 from the tips of the semiconductor layers 206 and 209. According to some embodiments, internal spacers 218 are recessed inwards at least until the ends of both first semiconductor layers 206 and second semiconductor layers 209 are exposed. Internal spacers 218 may be considered an integral part of its corresponding spacer structure 212, such that the spacer structures 212 discussed herein are considered to include the correspondingly aligned internal spacers 218.

FIG. 2G illustrates a cross-sectional view of the structure shown in FIG. 2F following the formation of source and drain regions, according to an embodiment of the present disclosure. Due to the vertically stacked spacing between first semiconductor layers 206 and second semiconductor layers 209, a similarly stacked formation of source and drain regions is created.

According to some embodiments, a first source or drain region 220*a* is formed adjacent to first ends of first semiconductor layers 206 while a second source or drain region 220*b* is formed adjacent to opposite second ends of first semiconductor layers 206. As noted above, first source or drain region 220*a* and second source or drain region 220*b* may include a first region of epitaxial growth from the ends of first semiconductor layers 206 and a second region of epitaxial growth or material deposition formed on the first region. In the example of a PMOS device, first source or drain region 220*a* and second source or drain region 220*b* may include a semiconductor material (e.g., group IV and group III-V semiconductor materials) having a dopant concentration of p-type dopants (e.g., boron).

According to some embodiments, a third source or drain region 222*a* is formed adjacent to first ends of second semiconductor layers 209 while a fourth source or drain region 222*b* is formed adjacent to opposite second ends of second semiconductor layers 209. As noted above, third source or drain region 222*a* and fourth source or drain region 222*b* may include a first region of epitaxial growth from the ends of second semiconductor layers 209 and a second region of epitaxial growth or material deposition formed on the first region. In the example of a NMOS device, third source or drain region 222*a* and fourth source or drain region 222*b* may include a semiconductor material (e.g., group IV and group III-V semiconductor materials) having a dopant concentration of n-type dopants (e.g., phosphorous). It should be noted that, in some embodiments, first source or drain region 220*a* and second source or drain region 220*b* are part of an NMOS device while third source or drain region 222*a* and fourth source or drain region 222*b* are part of a PMOS device.

According to some embodiments, another insulator layer 224 is formed between first source or drain region 220*a* and third source or drain region 222*a* and between third source or drain region 222*a* and fourth source or drain region 222*b* to provide sufficient isolation between the regions. Insulator layer 224 may be any suitable dielectric material, such as silicon oxide, silicon oxynitride, or silicon oxycarbonitride. In some embodiments, insulator layer 224 is a titanium-based dielectric. Insulator layer 224 may have a thickness between about 10 nm and about 30 nm. In some embodiments, insulator layer 224 represents more than one deposited layer, such as a SiN liner with an oxide fill material. A top insulator layer 226 may also be formed over third source or drain region 222*a* and over fourth source or drain region 222*b*. In some embodiments, a top surface of insulator layer 226 is planarized to be substantially level with a top surface of sacrificial gate structure 210. Polishing of the top surface of insulator layer 226 may be performed using chemical mechanical polishing (CMP). Top insulator layer 226 may be any suitable dielectric material and, in some examples, top insulator layer 226 is the same dielectric material as insulator layer 224.

FIG. 2H illustrates a cross-sectional view of the structure shown in FIG. 2G following the removal of the sacrificial gate structure 210, sacrificial layers 204 and spacer layer 208 from each fin, according to an embodiment of the present disclosure. Sacrificial gate structure 210 may be removed using any wet or dry isotropic process thus exposing the alternating layer stack of the fin within the trench left behind after the removal of sacrificial gate structure 210. Once sacrificial gate structure 210 has been removed, sacrificial layers 204 (along with spacer layer 208) may also be removed using a selective isotropic etching process that removes the material of sacrificial layers 204 (along with spacer layer 208) but does not remove (or removes very little of) first semiconductor layers 206 and second semiconductor layers 209. At this point, the suspended (sometimes called released) first semiconductor layers 206 form first nanoribbons 228 that extend between first source or drain region 220*a* and second source or drain region 220*b*, and the suspended second semiconductor layers 209 form second nanoribbons 230 that extend between third source or drain region 222*a* and fourth source or drain region 222*b*.

FIG. 2I illustrates a cross-sectional view of the structure shown in FIG. 2H following the masking of one of the fins and subsequent removal of the nanoribbons of one or more neighboring fins, according to an embodiment of the present disclosure. A masking layer 232 may be deposited to protect first nanoribbons 228 and second nanoribbons 230. Masking layer 232 may be any suitable photoresist or hard mask material, such as a carbon hard mask (CHM).

According to some embodiments, all suspended nanoribbons not protected by masking layer 232 are removed during an etching process. For example, a dry anisotropic etching process may be performed to selectively remove the exposed silicon nanoribbons in the various trenches between spacer structures 212 and 213. In another example, an isotropic etch may be performed which has a higher etch selectivity for the silicon nanoribbons. In either case, one or more nubs of semiconductor material 234 may be left behind within spacer structures 213. According to some embodiments, nubs of semiconductor material 234 are the ends of the removed nanoribbons that were protected from the etching process by spacer structures 213.

FIG. 2J illustrates a cross-sectional view of the structure shown in FIG. 2I following the formation of stressor material 236*a* and stressor material 236*b*, according to an embodiment of the present disclosure. Each of stressor materials 236*a* and 236*b* may be formed at the same time and thus include the same material composition. In some embodiments, stressor materials 236*a* and 236*b* are first deposited using any known deposition technique to fill their respective trenches and are recessed down to their final height. In some examples, the top surface of stressor materials 236*a* and 236*b* is aligned within the thickness of insulator layer 224. In some examples, stressor materials 236*a* and 236*b* are recessed such that they have a height that is at least equal to or greater than a height of the adjacent first source or drain region 220*a* and second source or drain region 220*b*.

In an example where nanoribbons 228 are part of a PMOS device, stressor materials 236*a* and 236*b* may be compressive stressor materials that include silicon nitride (SiN), helium implanted oxide, or various metal oxides, nitrides and carbides (e.g., TiAlN, TiO, TiAlC, TiSiO, AlO, AN), to name a few examples. In an example where nanoribbons 228 are part of a NMOS device, stressor materials 236*a* and 236*b* may be tensile stressor materials that include curable reflowable silicon oxide.

FIG. 2K illustrates a cross-sectional view of the structure shown in FIG. 2J following the formation of additional stressor material 238*a* and stressor material 238*b*, over stressor materials 236*a* and 236*b*, respectively, according to an embodiment of the present disclosure. Each of stressor materials 238*a* and 238*b* may be formed at the same time and thus include the same material composition. In some embodiments, stressor materials 238*a* and 238*b* are first deposited using any known deposition technique to fill their respective trenches with the top surface polished to be substantially level with a top surface of top insulator layer 226. In some embodiments, stressor materials 238*a* and 238*b* are deposited, polished, and then recessed to some final height that is at least greater than the height of third source or drain region 222*a* and fourth source or drain region 222*b*. In some examples, the bottom surface of stressor materials 238*a* and 238*b* is aligned within the thickness of insulator layer 224. In some examples, a cap layer is formed over stressor material 238*a* and stressor material 238*b* to protect the stressor materials during subsequent processes.

In an example where nanoribbons 230 are part of a PMOS device, stressor materials 238*a* and 238*b* may be compressive stressor materials that include silicon nitride (SiN), helium implanted oxide, or various metal oxides, nitrides and carbides (e.g., TiAlN, TiO, TiAlC, TiSiO, AlO, AN), to name a few examples. In an example where nanoribbons 230 are part of a NMOS device, stressor materials 238*a* and 238*b* may be tensile stressor materials that include curable reflowable silicon oxide. According to some embodiments, stressor materials 236*a* and 236*b* are compressive stressors while stressor materials 238*a* and 238*b* are tensile stressors, or vice versa.

FIG. 2L illustrates a cross-sectional view of the structure shown in FIG. 2K following the removal of masking layer 232 and the formation of a gate structure 240 around nanoribbons 228 and 230, according to an embodiment of the present disclosure. As noted above, gate structure 240 includes a gate dielectric and a gate electrode. The gate dielectric may be conformally deposited around first nanoribbons 228 and second nanoribbons 230 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second nanoribbons 228 and 230, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes any number of conductive layers that can be doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more work function layers, resistance-reducing layers, and/or barrier layers. The work function layers can include, for example, p-type work function materials (e.g., titanium nitride) for PMOS gates, or n-type work function materials (e.g., titanium aluminum carbide) for NMOS gates. According to some embodiments, the work function layers formed around first nanoribbons 228 can be different from the work function layers formed around second nanoribbons 230.

According to some embodiments, at least a portion of top insulator layer 226 is removed and replaced with frontside contacts 241 to provide electrical connections to third source or drain region 222*a* and fourth source or drain region 222*b*. As noted above, frontside contacts 241 may include any conductive material such as copper (Cu), ruthenium (Ru), tungsten (W), cobalt (Co), titanium (Ti), molybdenum (Mo), or any alloys thereof.

FIG. 2M illustrates a cross-sectional view of the structure shown in FIG. 2L following the removal of substrate 200 and the formation of dielectric layer 242 adjacent to sacrificial plugs 216, according to an embodiment of the present disclosure. Following the formation of various front-side contacts and interconnects (e.g., FEOL structures), a bulk portion of substrate 200 is removed until sacrificial plugs 216 are exposed from the backside, according to some embodiments. The bulk portion of substrate 200 may be removed using, for example, CMP and/or vapor phase etchants. According to some embodiments, once substrate 200 has been thinned to about the same thickness as sacrificial plugs 216, the remaining portion of substrate 200 coplanar with sacrificial plugs 216 is removed using, for example, an isotropic etching process. This leaves sacrificial plugs 216 extending outward from the backside of the device. A dielectric material may then be deposited over and around sacrificial plug 216 and polished back to once again expose sacrificial plugs 216 and form dielectric layer 242. As noted above, any suitable dielectric material may be used for dielectric layer 242, with some examples including silicon dioxide, aluminum oxide, or silicon oxycarbonitride.

FIG. 2N illustrates a cross-sectional view of the structure shown in FIG. 2M following the formation of backside contacts 244 and base dielectric layer 246, according to an embodiment of the present disclosure. Sacrificial plugs 216 may be removed using an isotropic etching process to selectively remove the material of the sacrificial plugs 216 from the backside of the structure and exposing the underside of first source or drain region 220*a* and second source or drain region 220*b*. Backside contacts 244 can then be formed within the recesses left behind from the removal of sacrificial plugs 216. According to some embodiments, backside contacts 244 may include any conductive material such as copper (Cu), ruthenium (Ru), tungsten (W), cobalt (Co), titanium (Ti), molybdenum (Mo), or any alloys thereof. In some examples, backside contacts 244 include the same material composition as frontside contacts 241. Dielectric base layer 246 may be formed over backside contacts 244 following polishing of backside contacts 244. As discussed above, dielectric base layer 246 may represent any number of backside interconnect layers that include dielectric layers and conductive traces to provide electrical connections with backside contacts 244.

FIGS. 3A-3H include cross-sectional views that collectively illustrate an example process that takes over from the structure shown in FIG. 2H and results in stressor materials only being formed adjacent to nanoribbons 228 (and not adjacent to nanoribbons 230). Each figure shows an example structure that results from the process flow up to that point in time, so the depicted structure evolves as the process flow continues, culminating in the structure shown in FIG. 3H, which is similar to the structure illustrated in FIG. 1B. Example materials and process parameters are given, but the present disclosure is not intended to be limited to any specific such materials or parameters, as will be appreciated.

Figure 3A:
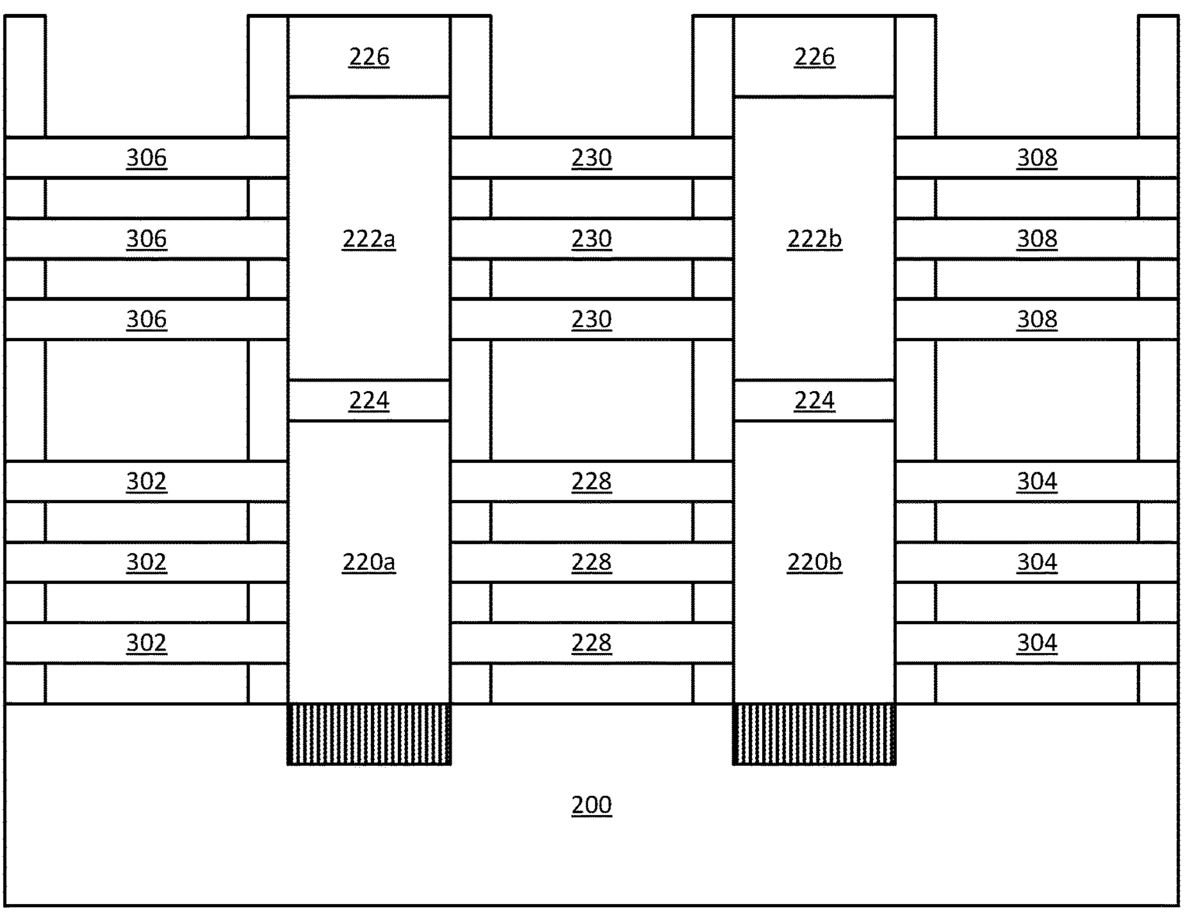
FIGS. 3A-3H are cross-sectional views that collectively illustrate an example process for forming stacked semiconductor devices with the lower device adjacent to a compressive or tensile stressor material, in accordance with some embodiments of the present disclosure.

FIG. 3A illustrates a cross-sectional view of the structure shown in FIG. 2H with additional nanoribbons identified. Accordingly, nanoribbons 302 extend between first source or drain region 220*a* and another source or drain region (not illustrated), nanoribbons 304 extend between second source or drain region 220*b* and another source or drain region (not illustrated), nanoribbons 306 extend between third source or drain region 222*a* and another source or drain region (not illustrated), and nanoribbons 308 extend between fourth source or drain region 222*b* and another source or drain region (not illustrated).

Figure 3B:
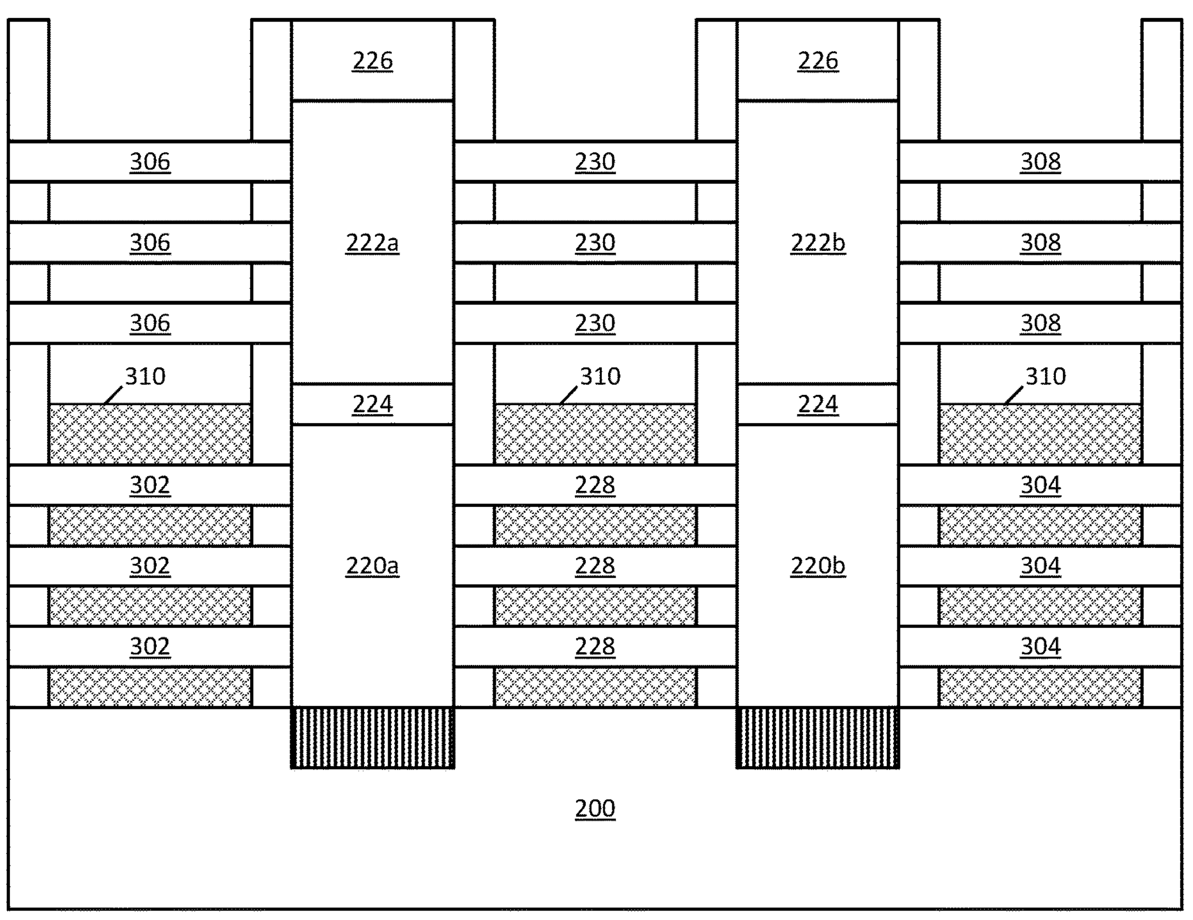

FIG. 3B illustrates a cross-sectional view of the structure shown in FIG. 3A following the formation of a sacrificial material 310 around nanoribbons 228, 302, and 304, according to an embodiment of the present disclosure. Sacrificial material 310 may include any suitable material that can be safely removed at a later time without damaging nanoribbons 228, 302, and 304. In some embodiments, sacrificial material 310 includes CHM. Sacrificial material 310 may be first deposited to a greater height within the trench (such as filling the trench) and subsequently recessed to its final height. According to some embodiments, sacrificial material 310 has a height that is at least greater than a height of the topmost nanoribbon of each of nanoribbons 228, 302, and 304, such that sacrificial material 310 surrounds each nanoribbon of nanoribbons 228, 302, and 304 within the respective trenches.

Figure 3C:
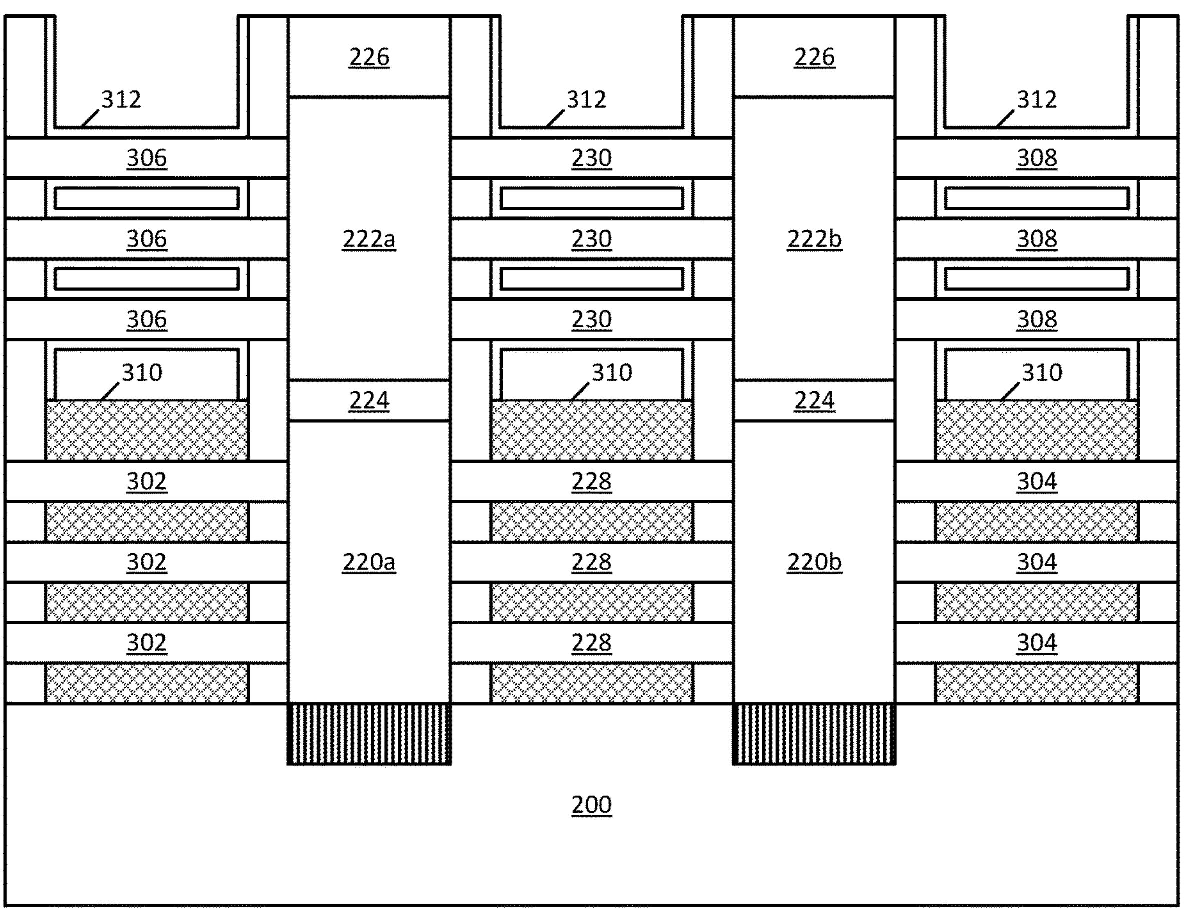

FIG. 3C illustrates a cross-sectional view of the structure shown in FIG. 3B following the formation of a liner material 312 around nanoribbons 230, 306, and 308, according to an embodiment of the present disclosure. Liner material 312 may include any suitable material that can be safely removed at a later time without damaging nanoribbons 230, 306, and 308. In some embodiments, liner material 312 includes aluminum nitride (AlN), titanium nitride (TiN), tantalum nitride (TaN), titanium aluminum nitride (TiAlN) silicon, or silicon oxide. In some examples, liner material 312 is deposited to a thickness between about 1 nm and about 5 nm.

Figure 3D:
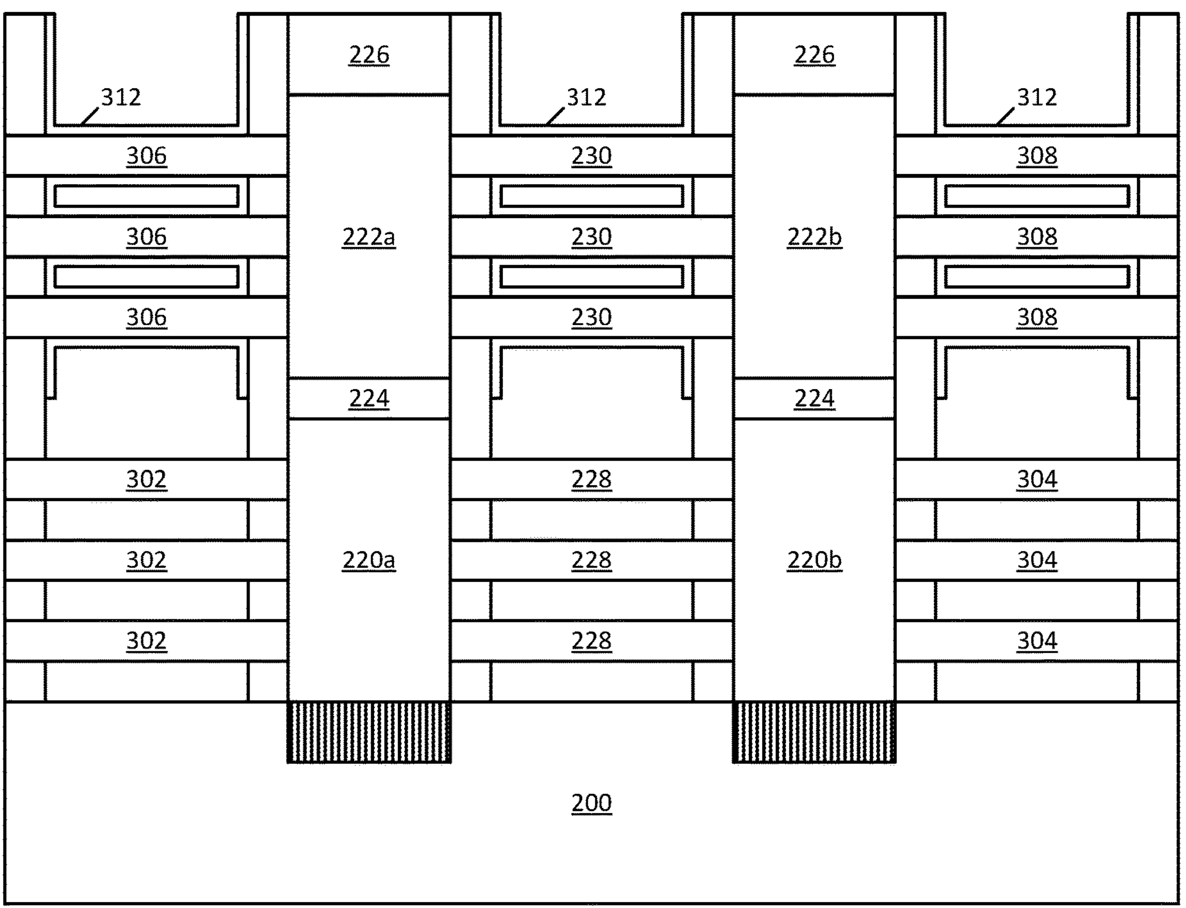

FIG. 3D illustrates a cross-sectional view of the structure shown in FIG. 3C following the removal of sacrificial material 310, according to an embodiment of the present disclosure. Liner material 312 remains around nanoribbons 230, 306, and 308 while sacrificial material 310 is removed, thus exposing nanoribbons 228, 302, and 304. Sacrificial material 310 may be removed using any suitable isotropic etching process.

Figure 3E:
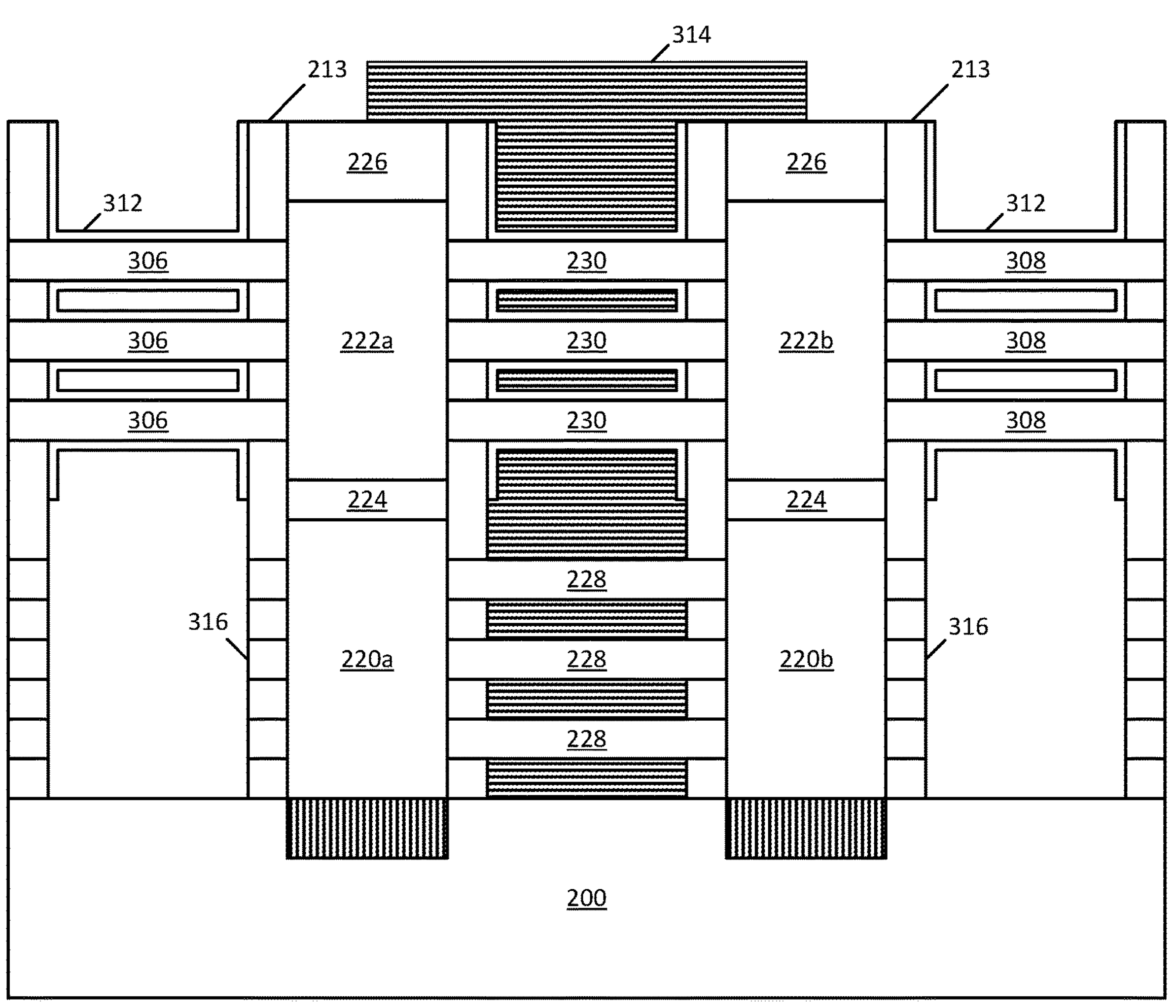

FIG. 3E illustrates a cross-sectional view of the structure shown in FIG. 3D following the formation of a masking layer 314 over nanoribbons 230 and 228, and the removal of nanoribbons 302 and 304, according to an embodiment of the present disclosure. Masking layer 314 may be any suitable photoresist or hard mask material, such as CHM. Liner material 312 protects nanoribbons 230, 306, and 308 while masking layer protects nanoribbons 228 and 230, thus leaving nanoribbons 302 and 304 exposed. The exposed nanoribbons may then be removed using an isotropic etching process that selectively removes the semiconductor material of nanoribbons 302 and 304. As discussed above, one or more nubs of semiconductor material 316 may be left behind within spacer structures 213 following the removal of nanoribbons 302 and 304.

Figure 3F:
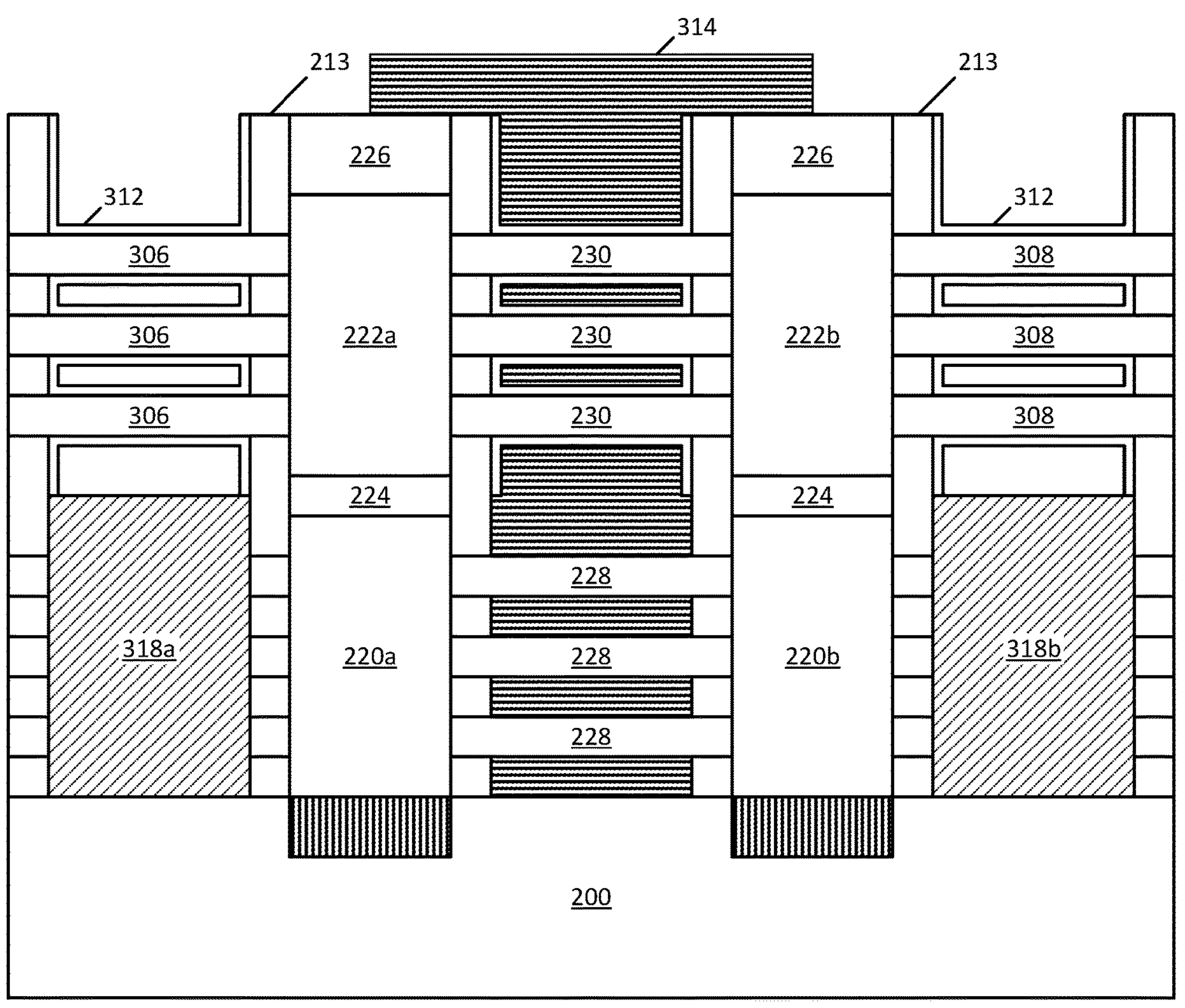

FIG. 3F illustrates a cross-sectional view of the structure shown in FIG. 3E following the formation of stressor materials 318*a* and 318*b*, according to an embodiment of the present disclosure. Each of stressor materials 318*a* and 318*b* may be formed at the same time and thus include the same material composition. In some embodiments, stressor materials 318*a* and 318*b* are first deposited using any known deposition technique to fill their respective trenches and are recessed down to their final height. In some examples, the top surface of stressor materials 318*a* and 318*b* is aligned within the thickness of insulator layer 224. In some examples, stressor materials 318*a* and 318*b* are recessed such that they have a height that is at least equal to or greater than a height of the adjacent first source or drain region 220*a* and second source or drain region 220*b*.

In an example where nanoribbons 228 are part of a PMOS device, stressor materials 318*a* and 318*b* may be compressive stressor materials that include silicon nitride (SiN), helium implanted oxide, or various metal oxides, nitrides and carbides (e.g., TiAlN, TiO, TiAlC, TiSiO, AlO, AlN), to name a few examples. In an example where nanoribbons 228 are part of a NMOS device, stressor materials 318*a* and 318*b* may be tensile stressor materials that include curable reflowable silicon oxide.

Figure 3G:
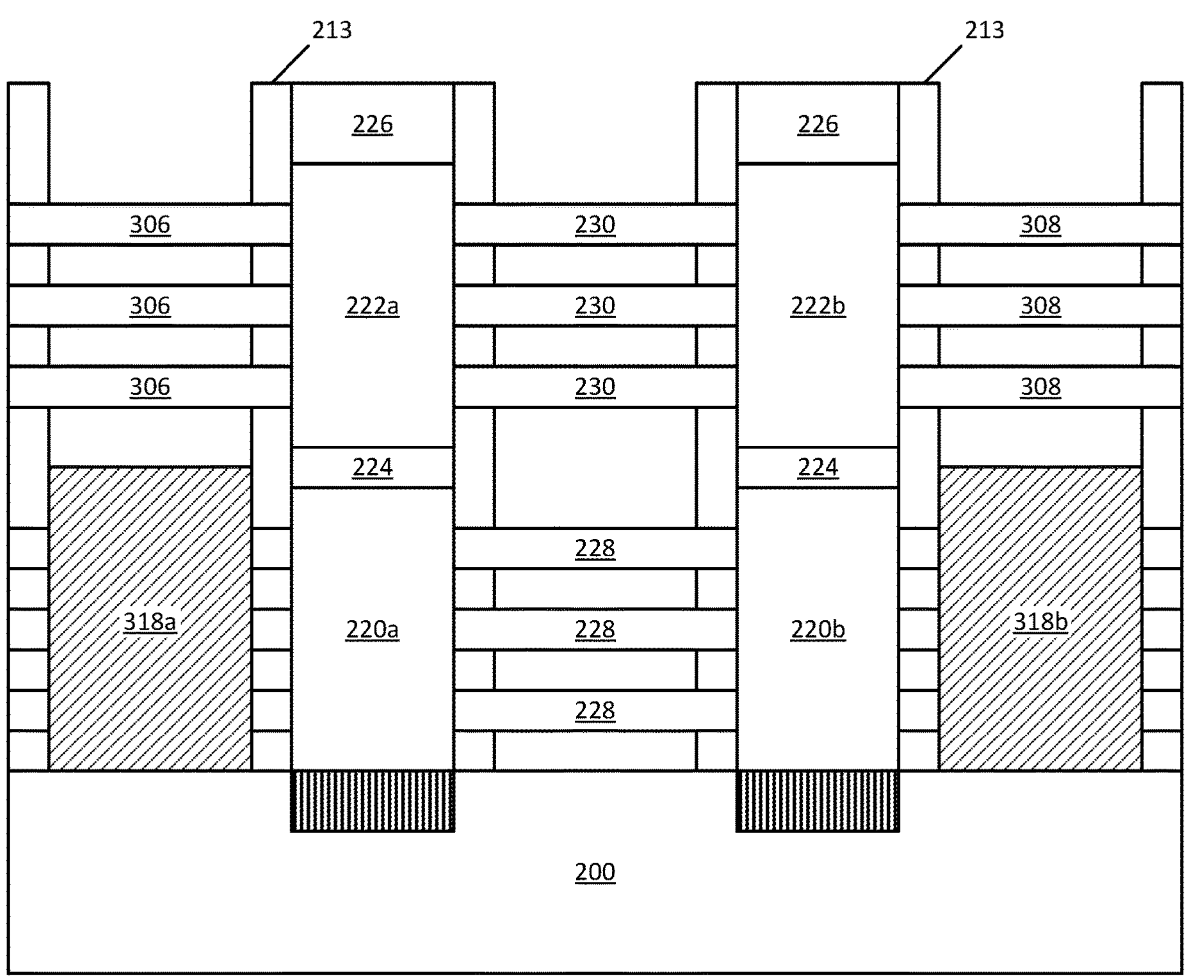

FIG. 3G illustrates a cross-sectional view of the structure shown in FIG. 3F following the removal of liner material 312 and masking layer 314, according to an embodiment of the present disclosure. Accordingly, each of nanoribbons 228, 230, 306, and 308 are exposed.

Figure 3H:
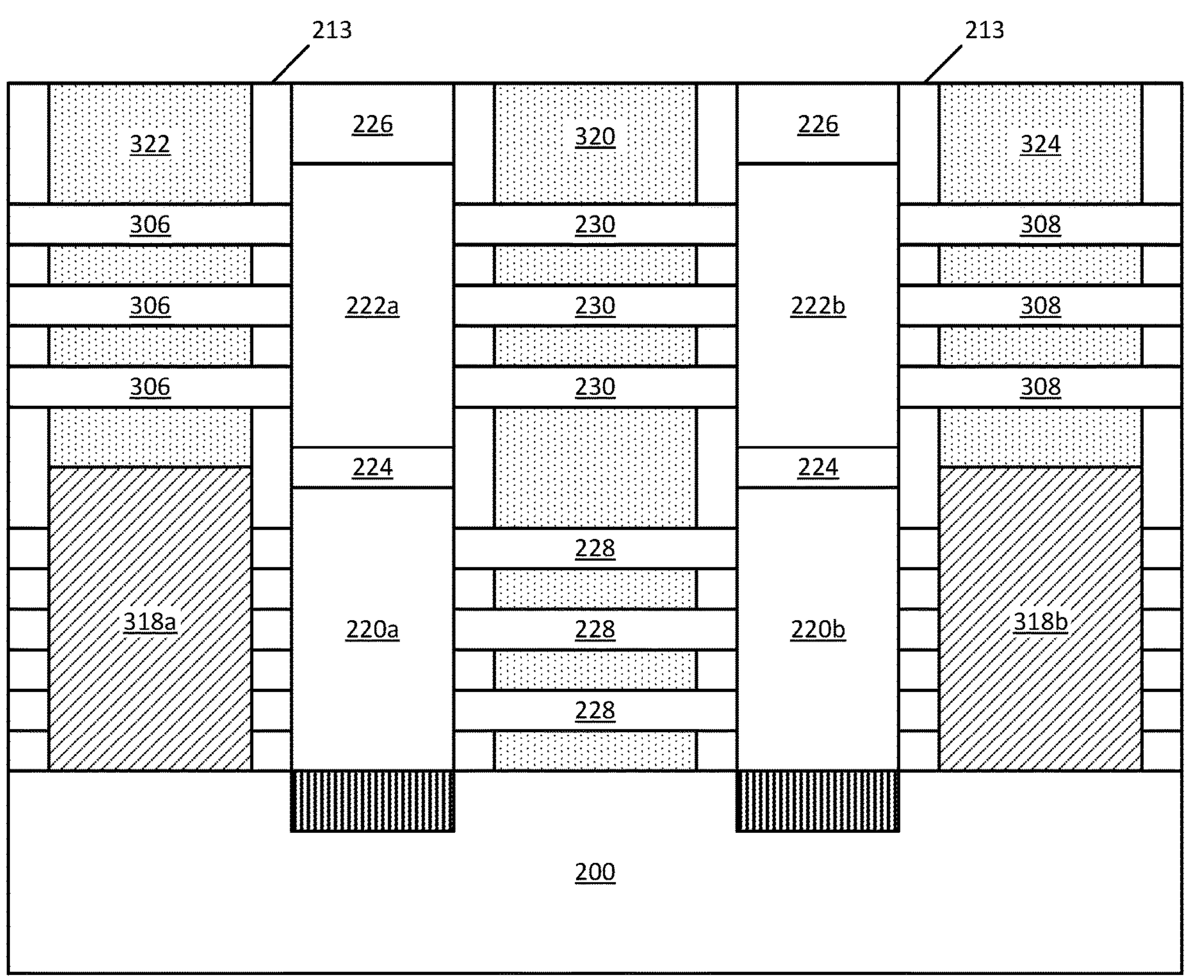

FIG. 3H illustrates a cross-sectional view of the structure shown in FIG. 3G following the formation of various gate structures around the exposed nanoribbons, according to an embodiment of the present disclosure. For example, a gate structure 320 may be formed around the stack of nanoribbons 228 and 230, a second gate structure 322 may be formed around nanoribbons 306, and a third gate structure 324 may be formed around nanoribbons 308. The features of gate structure 320 may be the same as gate structure 240 described above with reference to FIG. 2L. Second gate structure 322 and third gate structure 324 may each be substantially the same, and thus may each include work function metals suitable for either a p-channel or n-channel device. According to some embodiments, each of nanoribbons 306 and 308 form part of n-channel devices and second gate structure 322 and third gate structure 324 each include n-type work function layers around nanoribbons 306 and 308.

Additional fabrication operations similar to those illustrated in FIGS. 2L-2N may be performed to complete the structure.

FIGS. 4A-4E include cross-sectional views that collectively illustrate an example process that takes over from the structure shown in FIG. 2H and results in stressor materials only being formed adjacent to nanoribbons 230 (and not adjacent to nanoribbons 228). Each figure shows an example structure that results from the process flow up to that point in time, so the depicted structure evolves as the process flow continues, culminating in the structure shown in FIG. 4E, which is similar to the structure illustrated in FIG. 1C. Example materials and process parameters are given, but the present disclosure is not intended to be limited to any specific such materials or parameters, as will be appreciated.

Figure 4A:
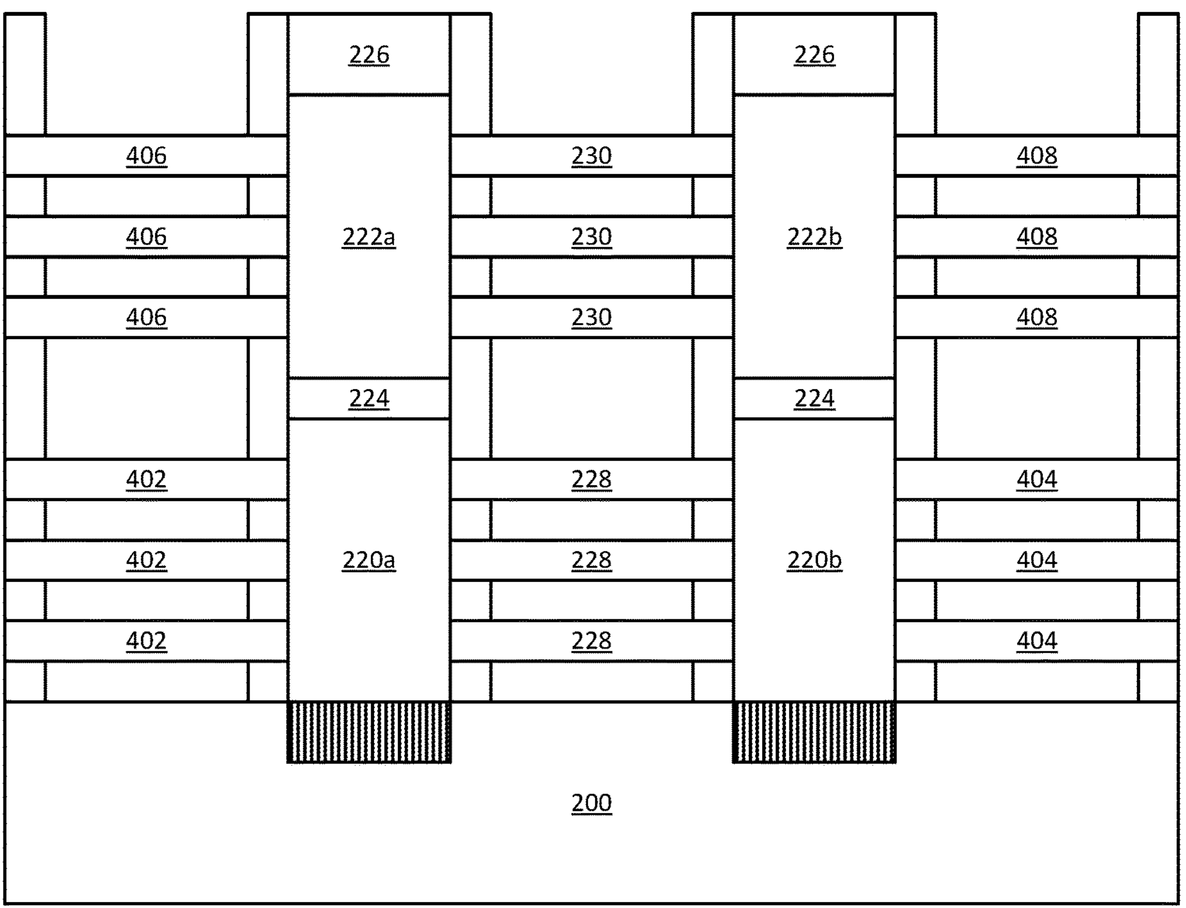
FIGS. 4A-4E are cross-sectional views that collectively illustrate an example process for forming stacked semiconductor devices with the upper device adjacent to a compressive or tensile stressor material, in accordance with some embodiments of the present disclosure.

FIG. 4A illustrates a cross-sectional view of the structure shown in FIG. 2H with additional nanoribbons identified. Accordingly, nanoribbons 402 extend between first source or drain region 220*a* and another source or drain region (not illustrated), nanoribbons 404 extend between second source or drain region 220*b* and another source or drain region (not illustrated), nanoribbons 406 extend between third source or drain region 222*a* and another source or drain region (not illustrated), and nanoribbons 408 extend between fourth source or drain region 222*b* and another source or drain region (not illustrated).

Figure 4B:
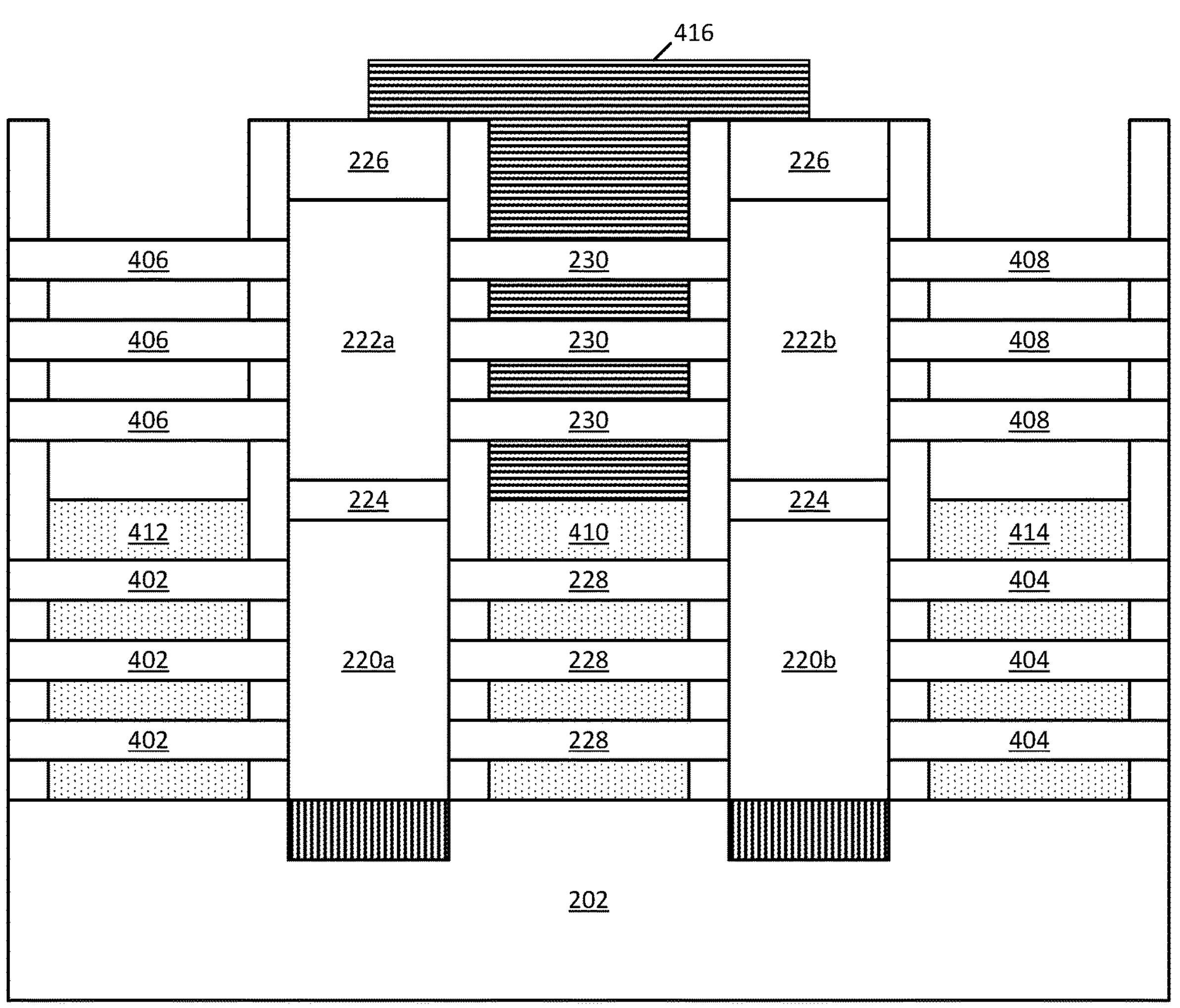

FIG. 4B illustrates a cross-sectional view of the structure shown in FIG. 4A following the formation of various gate structures around nanoribbons 228, 402, and 404, according to an embodiment of the present disclosure. Each of gate structures 410, 412, and 414 may include similar layers and materials. As discussed above for gate structure 240, gate structures 410, 412, and 414 each include a gate dielectric around corresponding nanoribbons 228, 402, and 404. Additionally, gate structures 410, 412, and 414 each include work function metals suitable for either a p-channel or n-channel device. According to some embodiments, each of nanoribbons 228, 402 and 404 form part of p-channel devices and gate structures 410, 412, and 414 each include p-type work function layers around nanoribbons 228, 402, and 404. Gate structures 410, 412, and 414 may be initially formed at a greater height within the trenches (e.g., filling the trenches) and subsequently recessed to their final height. In some examples, the top surface of gate structures 410, 412, and 414 is aligned within the thickness of insulator layer 224. In some examples, gate structures 410, 412, and 414 are recessed such that they have a height that is at least equal to or greater than a height of the adjacent first source or drain region 220*a* and second source or drain region 220*b*.

Following the formation of gate structures 410, 412, and 414, a masking layer 416 is formed to protect nanoribbons 230, according to some embodiments. Masking layer 416 may be any suitable photoresist or hard mask material, such as CHM. At this stage, nanoribbons 228, 402, and 404 are protected by gate structures 410, 412, and 414, and nanoribbons 230 are protected by masking layer 416, leaving nanoribbons 406 and 408 exposed.

Figure 4C:
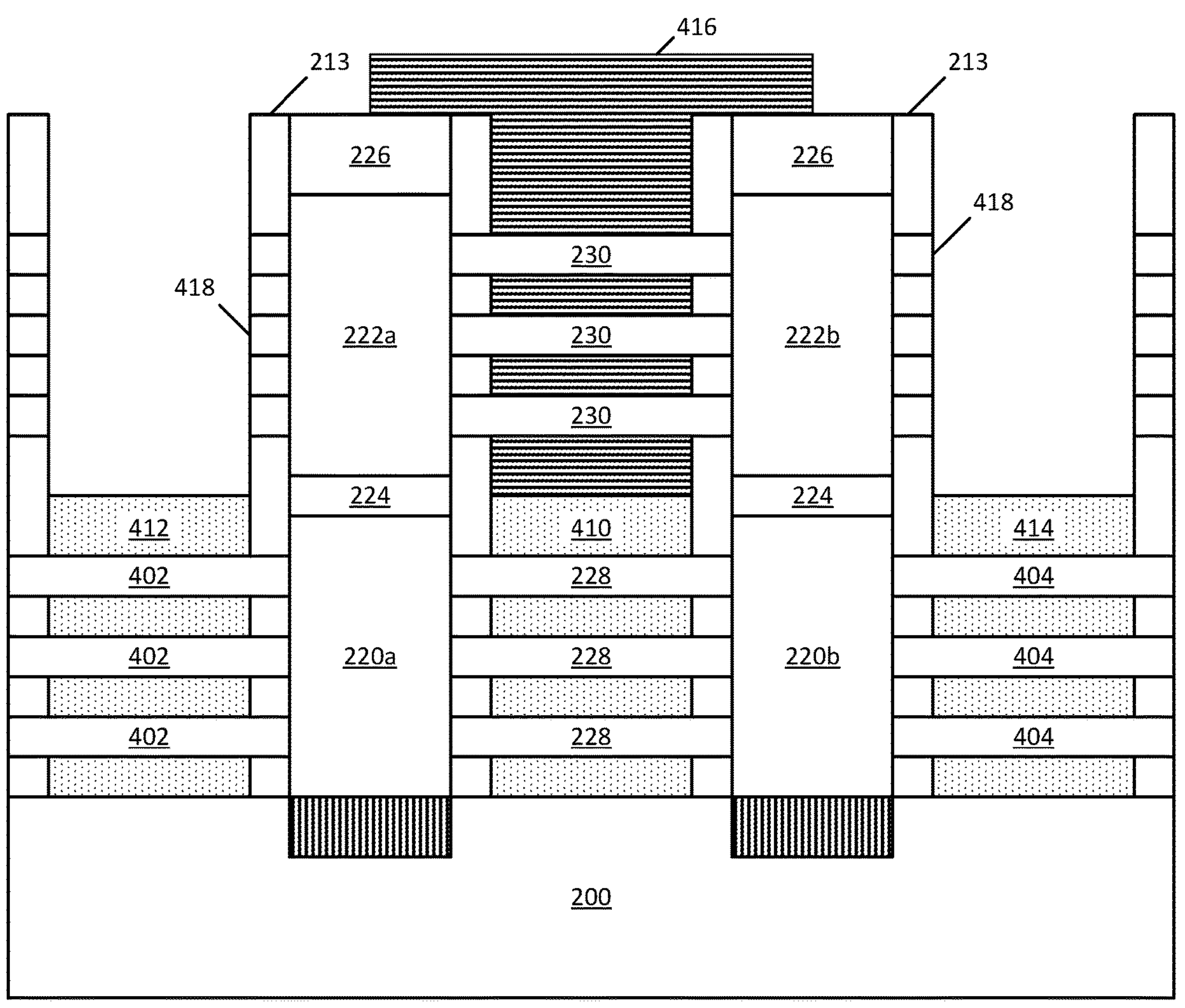

FIG. 4C illustrates a cross-sectional view of the structure shown in FIG. 4B following the removal of nanoribbons 406 and 408, according to an embodiment of the present disclosure. The exposed nanoribbons 406 and 408 may be removed using an anisotropic or isotropic etching process that selectively removes the semiconductor material of nanoribbons 406 and 408. As discussed above, one or more nubs of semiconductor material 418 may be left behind within spacer structures 213 following the removal of nanoribbons 406 and 408.

Figure 4D:
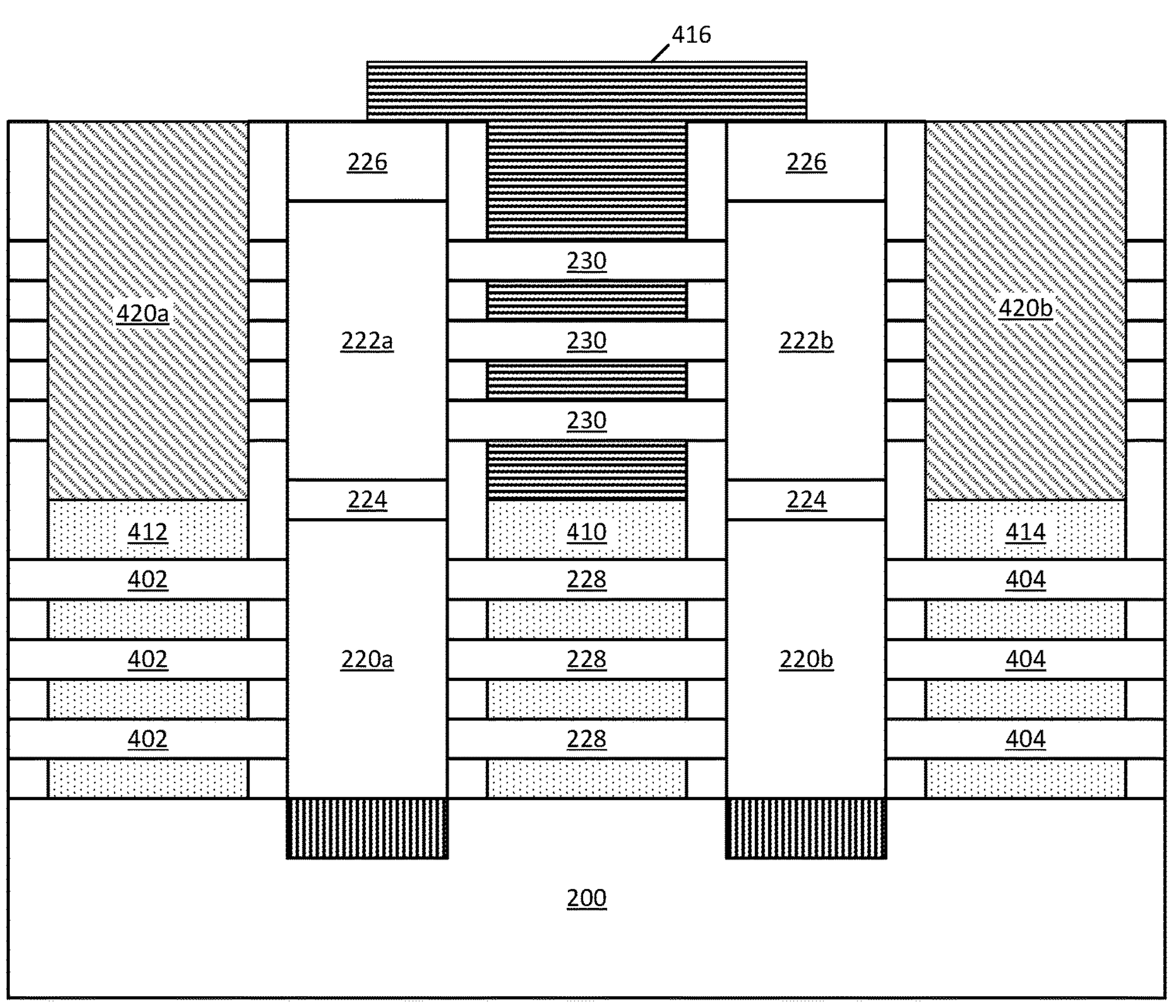

FIG. 4D illustrates a cross-sectional view of the structure shown in FIG. 4C following the formation of stressor materials 420*a* and 420*b*, according to an embodiment of the present disclosure. Each of stressor materials 420*a* and 420*b* may be formed at the same time and thus include the same material composition. In some embodiments, stressor materials 420*a* and 420*b* are first deposited using any known deposition technique to fill their respective trenches and are either polished to be substantially planar with a top of the trench or are recessed down to their final height. In some examples, the bottom surface of stressor materials 420*a* and 420*b* is aligned within the thickness of insulator layer 224. In some examples, stressor materials 420*a* and 420*b* are recessed such that they have a height that is at least equal to or greater than a height of the adjacent third source or drain region 222*a* and fourth source or drain region 222*b*. In some embodiments, a cap layer is formed over stressor materials 420*a* and 420*b* to protect the stressor materials during subsequent processes.

In an example where nanoribbons 230 are part of a PMOS device, stressor materials 420*a* and 420*b* may be compressive stressor materials that include silicon nitride (SiN), helium implanted oxide, or various metal oxides, nitrides and carbides (e.g., TiAlN, TiO, TiAlC, TiSiO, AlO, AN), to name a few examples. In an example where nanoribbons 230 are part of a NMOS device, stressor materials 420*a* and 420*b* may be tensile stressor materials that include curable reflowable silicon oxide.

Figure 4E:
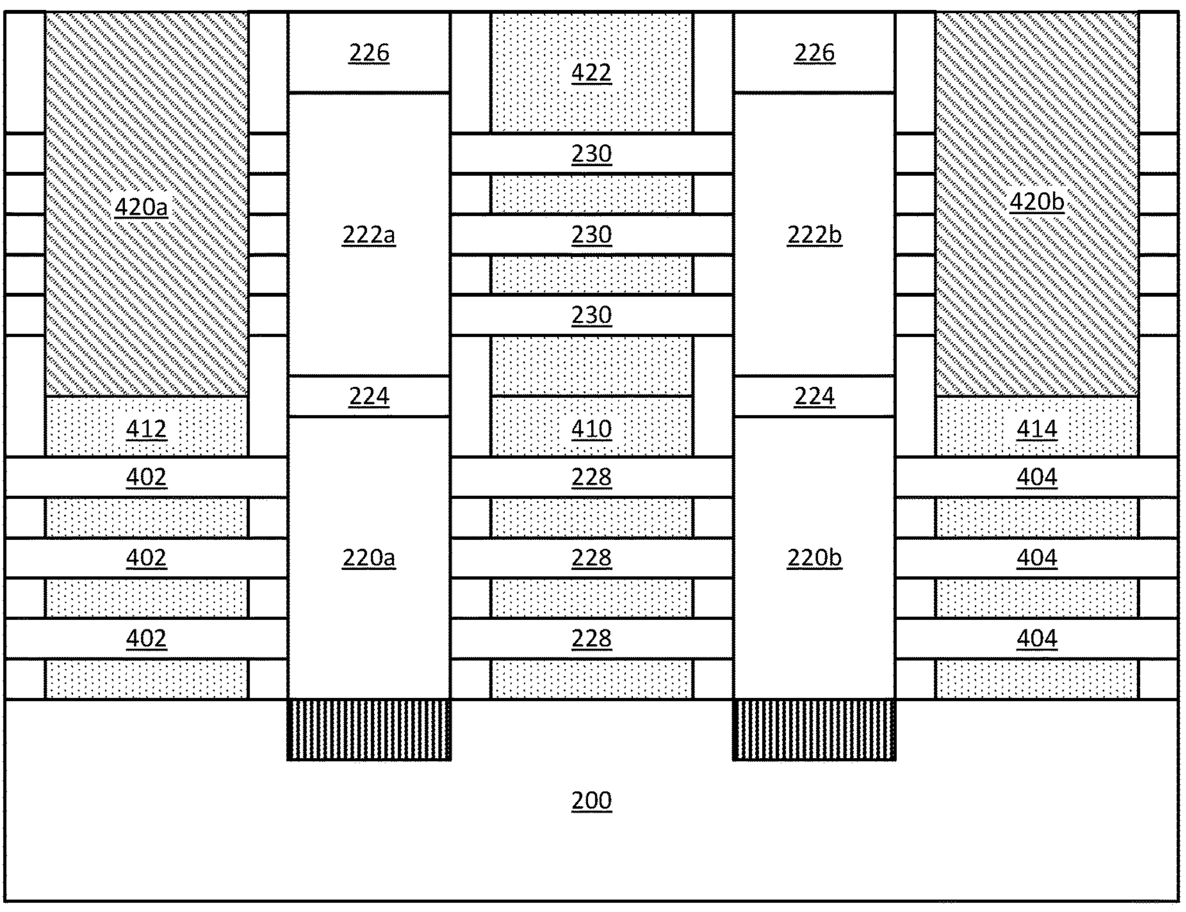

FIG. 4E illustrates a cross-sectional view of the structure shown in FIG. 4D following the removal of masking layer 416 and the formation of gate structure 422 over gate structure 410, according to an embodiment of the present disclosure. The features of gate structures 422 and 410 collectively may be the same as gate structure 240 described above with reference to FIG. 2L. According to some embodiments, nanoribbons 230 form part of an n-channel device and gate structure 422 includes n-type work function layers around nanoribbons 230. Thus, in some examples, gate structure 422 includes n-type work function layers while gate structure 410 includes p-type work function layers.

Additional fabrication operations similar to those illustrated in FIGS. 2L-2N may be performed to complete the structure.

Figure 5:
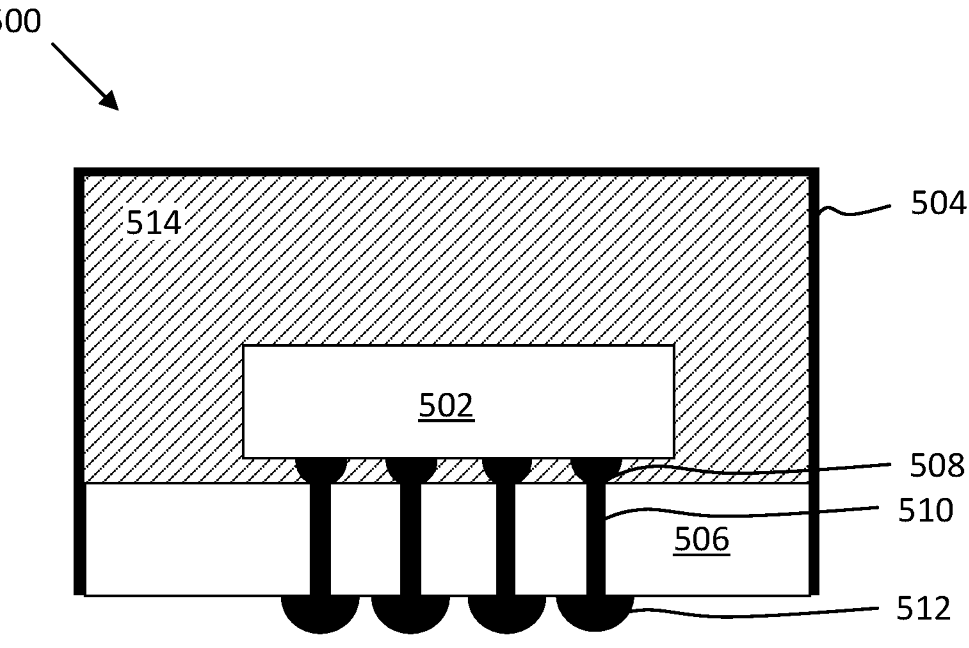
FIG. 5 illustrates a cross-section view of a chip package containing one or more semiconductor dies, in accordance with some embodiments of the present disclosure.

FIG. 5 illustrates an example embodiment of a chip package 500, in accordance with an embodiment of the present disclosure. As can be seen, chip package 500 includes one or more dies 502. One or more dies 502 may include at least one integrated circuit having semiconductor devices, such as any of the semiconductor devices disclosed herein. One or more dies 502 may include any other circuitry used to interface with other devices formed on the dies, or other devices connected to chip package 500, in some example configurations.

As can be further seen, chip package 500 includes a housing 504 that is bonded to a package substrate 506. The housing 504 may be any standard or proprietary housing, and may provide, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board (PCB). One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via, or an interconnect structure that meanders through the thickness of substrate 506 to contact one or more intermediate locations therein). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between dies 502 and package substrate 506 as an underfill material, as well as between dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to being electrically insulating.

Methodology

Figure 6:
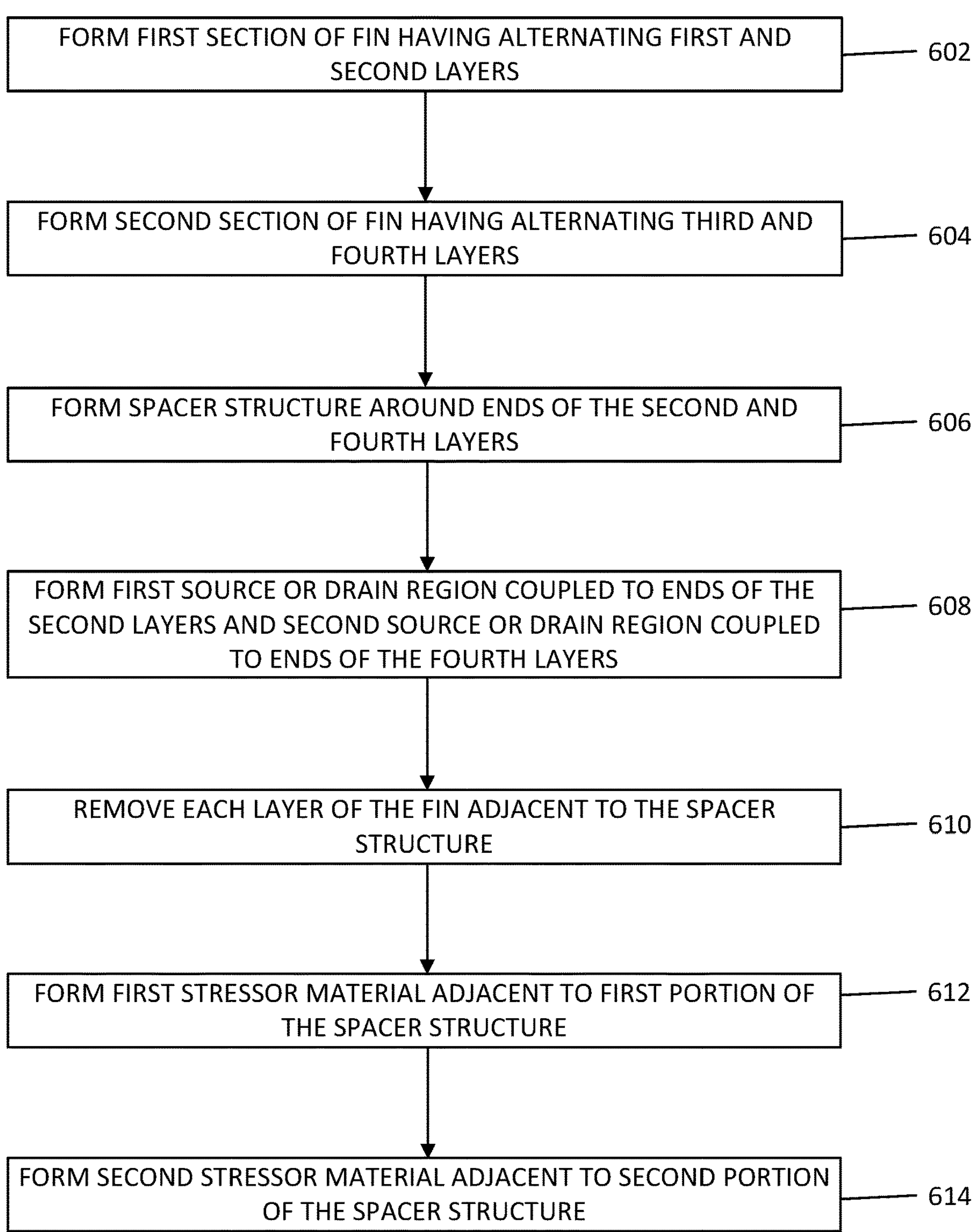
FIG. 6 is a flowchart of a fabrication process for stacked semiconductor devices, including a lower device adjacent to one of a compressive or tensile stressor material and an upper device adjacent to the other one of a compressive or tensile stressor material, in accordance with an embodiment of the present disclosure.

FIG. 6 is a flow chart of a method 600 for forming at least a portion of an integrated circuit, according to an embodiment. Various operations of method 600 may be illustrated in FIGS. 2A-2N. However, the correlation of the various operations of method 600 to the specific components illustrated in the aforementioned figures is not intended to imply any structural and/or use limitations. Rather, the aforementioned figures provide some example embodiments of method 600. Other operations may be performed before, during, or after any of the operations of method 600. Some of the operations of method 600 may be performed in a different order than the illustrated order.

Method 600 begins with operation 602 where a first section of a fin is formed having alternating first and second layers. The first layers may be sacrificial layers (e.g., comprising SiGe) while the second layers include a semiconductor material (e.g., Si, SiGe, Ge, InP, or GaAs) suitable for use as a nanoribbon channel. The first section may be formed over a substrate or over a sacrificial spacer layer. The thickness of each of the first and second layers may be between about 5 nm and about 20 nm or between about 5 nm and about 10 nm. Each of the first and second layers may be deposited using any known material deposition technique, such as CVD, PECVD, PVD, or ALD.

Method 600 continues with operation 604 where a second section of the fin is formed having alternating third and fourth layers. The third layers may be substantially the same as the first layers (sacrificial layers) with substantially the same thickness of the first layers. The fourth layers include a semiconductor material (e.g., Si, SiGe, Ge, InP, or GaAs) suitable for use as a nanoribbon channel and may include substantially the same material composition as the second layers. The thickness of each of the third and fourth layers may be between about 5 nm and about 20 nm or between about 5 nm and about 10 nm. Each of the third and fourth layers may be deposited using any known material deposition technique, such as CVD, PECVD, PVD, or ALD. According to some embodiments, the second fin section is separated from the first fin section by a sacrificial spacer layer that includes the same material composition as any of the first and third layers.

According to some embodiments, once the material layers have been deposited, one or more fins may be defined via an anisotropic etching process, such as RIE, using a patterned mask material to protect the fins from the etch. The fin height may include the alternating material layers of each of the fin sections and a subfin portion formed from the substrate material. In some other embodiments, trenches are first formed in a dielectric material and the alternating material layers of the aforementioned sections are formed within the trenches to form one or more multilayer fins. Separate fins used to define specific semiconductor devices may be further formed by patterning sacrificial gates and corresponding gate spacer structures on sidewalls of the sacrificial gates that extend over the fin and removing portions of the fin outside of the sacrificial gates and gate spacer structures.

Method 600 continues with operation 606 where spacer structures are formed around ends of the second and fourth layers. The exposed ends of the first and third layers may be laterally recessed using an isotropic etching process that removes the sacrificial material of the first and third layers while removing little to none of the second and fourth layers. A dielectric material may then be formed over and around the ends of the first and third layers using any conformal deposition process. The dielectric material may then be recessed inwards using an isotropic etching process to re-expose the tips of the first and third layers.

Method 600 continues with operation 608 where a first source or drain region is formed that is coupled to at least the ends of the second layers of the first fin section and a second source or drain region is formed that is coupled to at least the ends of the fourth layers of the second fin section. The first source or drain region may be epitaxially grown from the exposed tips of the second layers (e.g., grown from semiconductor seed material), while the dielectric spacer material fills a region between the second layers and adjacent to the ends of the second layers. At least a portion of the second source or drain region may be epitaxially grown from exposed tips of the fourth layers (e.g., grown from semiconductor seed material), while the internal dielectric spacer material fills a region between the fourth layers and adjacent to the ends of the fourth layers.

Method 600 continues with operation 610 where each layer of the fin adjacent to the spacer structure is removed. The fin layers may be removed in stages. For example, the first and third layers may be removed first thus leaving suspended second layers and suspended fourth layers extending between parallel spacer structures. Afterwards, the suspended second layers and the suspended fourth layers may be removed using a dry anisotropic etching process to selectively remove the exposed suspended nanoribbons. In another example, an isotropic etch may be performed which may have a higher etch selectivity for the material of the second and fourth layers. In either case, one or more nubs of semiconductor material may be left behind within the spacer structures. According to some embodiments, the nubs of semiconductor material are the ends of the removed second and fourth layers that were protected from the etching process by the spacer structures.

Method 600 continues with operation 612 where a first stressor material is formed adjacent to a first portion of the spacer structure. According to some embodiments, the first portion of the spacer structure is laterally adjacent to the first source or drain region, such that the first portion of the spacer structure is sandwiched between the first source or drain region and the first stressor material. In some embodiments, the first stressor material is deposited using any known deposition technique to fill the gate trench between the parallel spacer structures and is recessed down to its final height. In some examples, the first stressor material is recessed such that it has a height that is at least equal to or greater than a height of the adjacent first source or drain region.

The first stressor material may be a compressive stressor material that includes silicon nitride (SiN), helium implanted oxide, or various metal oxides, nitrides and carbides (e.g., TiAlN, TiO, TiAlC, TiSiO, AlO, AlN), to name a few examples. In another example, the first stressor material is a tensile stressor material that includes curable reflowable silicon oxide.

Method 600 continues with operation 614 where a second stressor material is formed over the first stressor material and adjacent to a second portion of the spacer structure. According to some embodiments, the second portion of the spacer structure is laterally adjacent to the second source or drain region, such that the second portion of the spacer structure is sandwiched between the second source or drain region and the second stressor material. In some embodiments, the second stressor material is deposited using any known deposition technique to fill the gate trench between the parallel spacer structures and is recessed down to its final height. In some examples, the second stressor material is recessed such that it has a height that is at least equal to or greater than a height of the adjacent second source or drain region.

The second stressor material may be a compressive stressor material that includes silicon nitride (SiN), helium implanted oxide, or various metal oxides, nitrides and carbides (e.g., TiAlN, TiO, TiAlC, TiSiO, AlO, AlN), to name a few examples. In another example, the second stressor material is a tensile stressor material that includes curable reflowable silicon oxide. The first stressor material may be a compressive stressor material while the second stressor material is a tensile stressor material, or vice versa.

Figure 7:
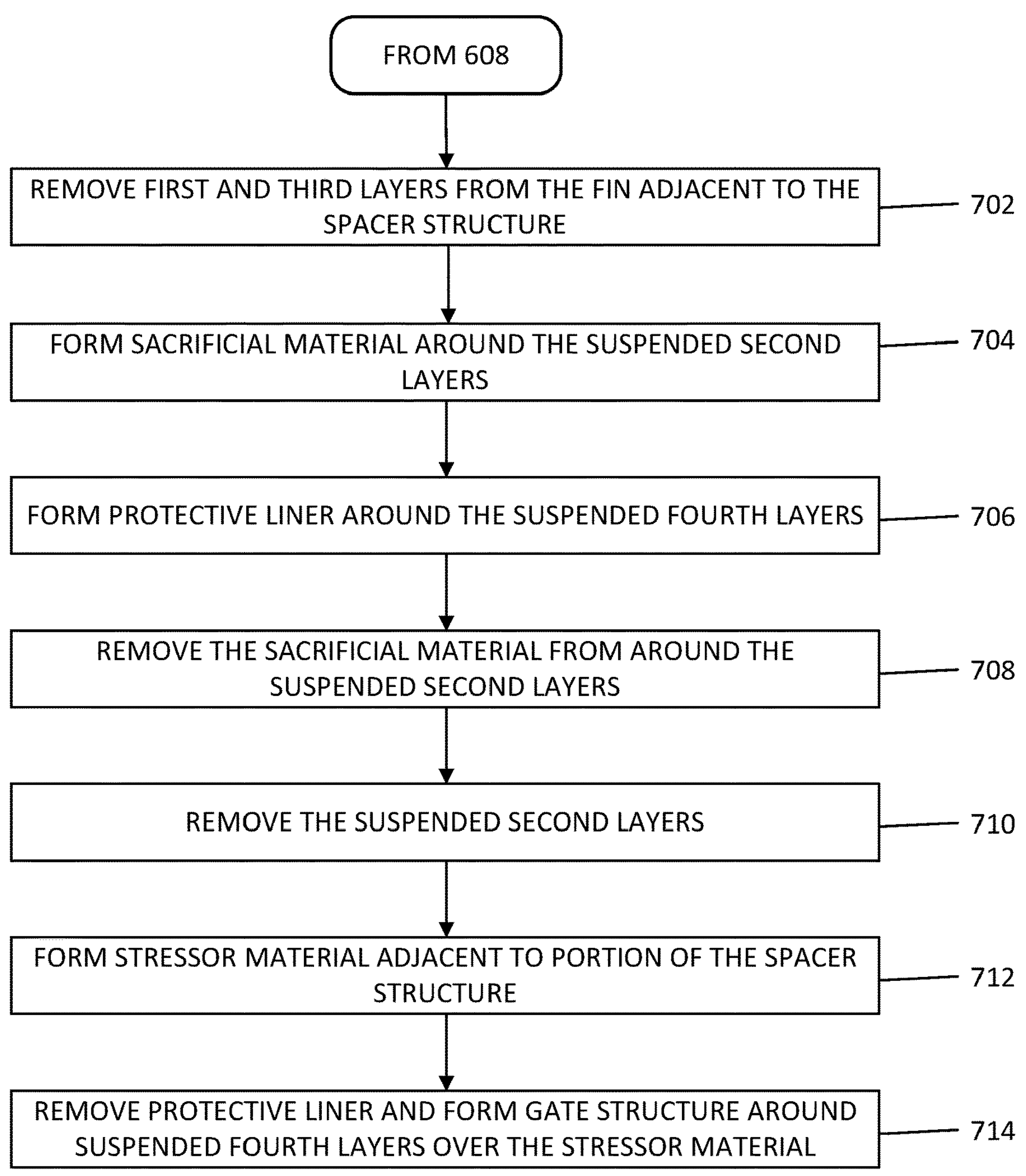
FIG. 7 is a flowchart of a fabrication process for stacked semiconductor devices with the lower device adjacent to a stressor material and the upper device not adjacent to a stressor material, in accordance with an embodiment of the present disclosure.

FIG. 7 is a flow chart of another method 700 for forming at least a portion of an integrated circuit, according to an embodiment. Various operations of method 700 may be illustrated in FIGS. 3A-3H. However, the correlation of the various operations of method 700 to the specific components illustrated in the aforementioned figures is not intended to imply any structural and/or use limitations. Rather, the aforementioned figures provide some example embodiments of method 700. Other operations may be performed before, during, or after any of the operations of method 700. Some of the operations of method 700 may be performed in a different order than the illustrated order.

Method 700 begins with operation 702, which picks up after operation 608 from method 600. In operation 702, the first and third layers of the fin adjacent to the spacer structure are removed. These layers may be removed using any known isotropic etching process that selectively removes the first and third layers while removing little to none of the second and fourth layers. Removal of the first and third layers leaves behind suspended second layers and suspended fourth layers in the gate trench between the parallel spacer structures.

Method 700 continues with operation 704 where a sacrificial material is formed around the suspended second layers. The sacrificial material may include CHM and be deposited to a first height and then recessed such that each of the suspended fourth layers are exposed. The sacrificial material may surround each of the suspended second layers.

Method 700 continues with operation 706 where a protective liner is formed around the suspended fourth layers. The protective liner may include any suitable material that can be safely removed at a later time without damaging the suspended fourth layers. In some embodiments, the protective liner includes any of AlN, TiN, TaN, TiAlN, silicon, or silicon oxide. The protective liner may be deposited to a thickness between about 1 nm and about 5 nm, in some example cases.

Method 700 continues with operation 708 where the sacrificial material is removed from around the suspended second layers. The sacrificial material may be removed using an ashing process or any other suitable isotropic etching process to selectively remove the sacrificial material.

Method 700 continues with operation 710 where the suspended second layers are removed. The suspended second layers may be removed using any suitable isotropic etching process that selectively removes the semiconductor material of the second layers. The suspended fourth layers are protected from the etching process by the protective liner. As discussed above, removal of the suspended second layers can leave behind nubs of semiconductor material within the spacer structure.

Method 700 continues with operation 712 where a stressor material is formed adjacent to a portion of the spacer structure. According to some embodiments, the portion of the spacer structure is laterally adjacent to the first source or drain region, such that the portion of the spacer structure is sandwiched between the first source or drain region and the stressor material. In some embodiments, the stressor material is deposited using any known deposition technique to fill the gate trench between the parallel spacer structures and is recessed down to its final height. In some examples, the stressor material is recessed such that it has a height that is at least equal to or greater than a height of the adjacent first source or drain region. In some examples, the height of the stressor material remains below the lowest suspended fourth layer.

The stressor material may be a compressive stressor material that includes silicon nitride (SiN), helium implanted oxide, or various metal oxides, nitrides and carbides (e.g., TiAlN, TiO, TiAlC, TiSiO, AlO, AlN), to name a few examples. In another example, the stressor material is a tensile stressor material that includes curable reflowable silicon oxide.

Method 700 continues with operation 714 where the protective liner is removed and a gate structure is formed around the suspended fourth layers over the stressor material. The protective liner may be removed, for instance, using any suitable isotropic etching process. The gate structure may include one or more gate dielectric layers followed by a gate electrode. The gate electrode may include any number of conductive layers, such as one or more work function metals and a fill metal. As discussed above, the work function metals are different depending on whether the fourth layers are part of a p-channel device or an n-channel device.

Figure 8:
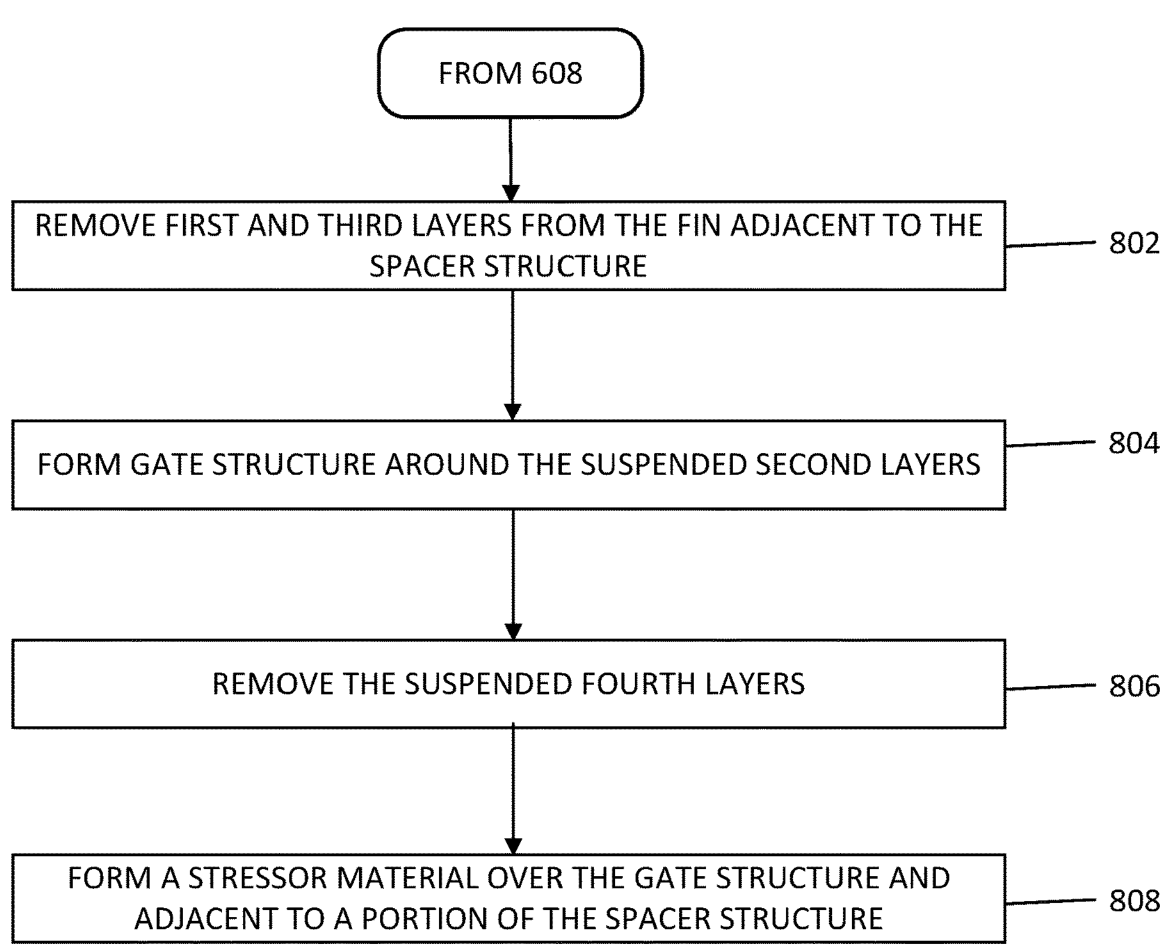
FIG. 8 is a flowchart of a fabrication process for stacked semiconductor devices with the upper device adjacent to a stressor material and the lower device not adjacent to a stressor material, in accordance with an embodiment of the present disclosure.

FIG. 8 is a flow chart of another method 800 for forming at least a portion of an integrated circuit, according to an embodiment. Various operations of method 800 may be illustrated in FIGS. 4A-4E. However, the correlation of the various operations of method 800 to the specific components illustrated in the aforementioned figures is not intended to imply any structural and/or use limitations. Rather, the aforementioned figures provide some example embodiments of method 800. Other operations may be performed before, during, or after any of the operations of method 800. Some of the operations of method 800 may be performed in a different order than the illustrated order.

Method 800 begins with operation 802, which picks up after operation 608 from method 600. In operation 802, the first and third layers of the fin adjacent to the spacer structure are removed. These layers may be removed using any known isotropic etching process that selectively removes the first and third layers while removing little to none of the second and fourth layers. Removal of the first and third layers leaves behind suspended second layers and suspended fourth layers in the gate trench between the parallel spacer structures.

Method 800 continues with operation 804 where a gate structure is formed around the suspended second layers. The gate structure may include one or more gate dielectric layers followed by a gate electrode. The gate electrode may include any number of conductive layers, such as one or more work function metals and a fill metal. As discussed above, the work function metals are different depending on whether the fourth layers are part of a p-channel device or an n-channel device. According to some embodiments, the gate electrode layers may be formed throughout an entire height of the gate trench, and then recessed to the final height of the gate structure. For example, the gate structure may be recessed such that it surrounds each of the suspended second layers, but is beneath the lowest suspended fourth layer within the gate trench.

Method 800 continues with operation 806 where the suspended fourth layers above the gate structure are removed. The suspended fourth layers may be removed using any suitable isotropic etching process that selectively removes the semiconductor material of the fourth layers. The second layers are protected from the etching process by the gate structure formed around them. As discussed above, removal of the suspended fourth layers can leave behind nubs of semiconductor material within the spacer structure.

Method 800 continues with operation 808 where a stressor material is formed over the gate structure and adjacent to a portion of the spacer structure. According to some embodiments, the portion of the spacer structure is laterally adjacent to the second source or drain region, such that the portion of the spacer structure is sandwiched between the second source or drain region and the stressor material. In some embodiments, the stressor material is deposited using any known deposition technique to fill the gate trench between the parallel spacer structures and may be subsequently recessed down to its final height. In some examples, the stressor material is recessed such that it has a height that is at least equal to or greater than a height of the adjacent second source or drain region. In some examples, the stressor material fills a remaining height of the gate trench above the gate structure.

The stressor material may be a compressive stressor material that includes silicon nitride (SiN), helium implanted oxide, or various metal oxides, nitrides and carbides (e.g., TiAlN, TiO, TiAlC, TiSiO, AlO, AlN), to name a few examples. In another example, the stressor material is a tensile stressor material that includes curable reflowable silicon oxide.

Example System

Figure 9:
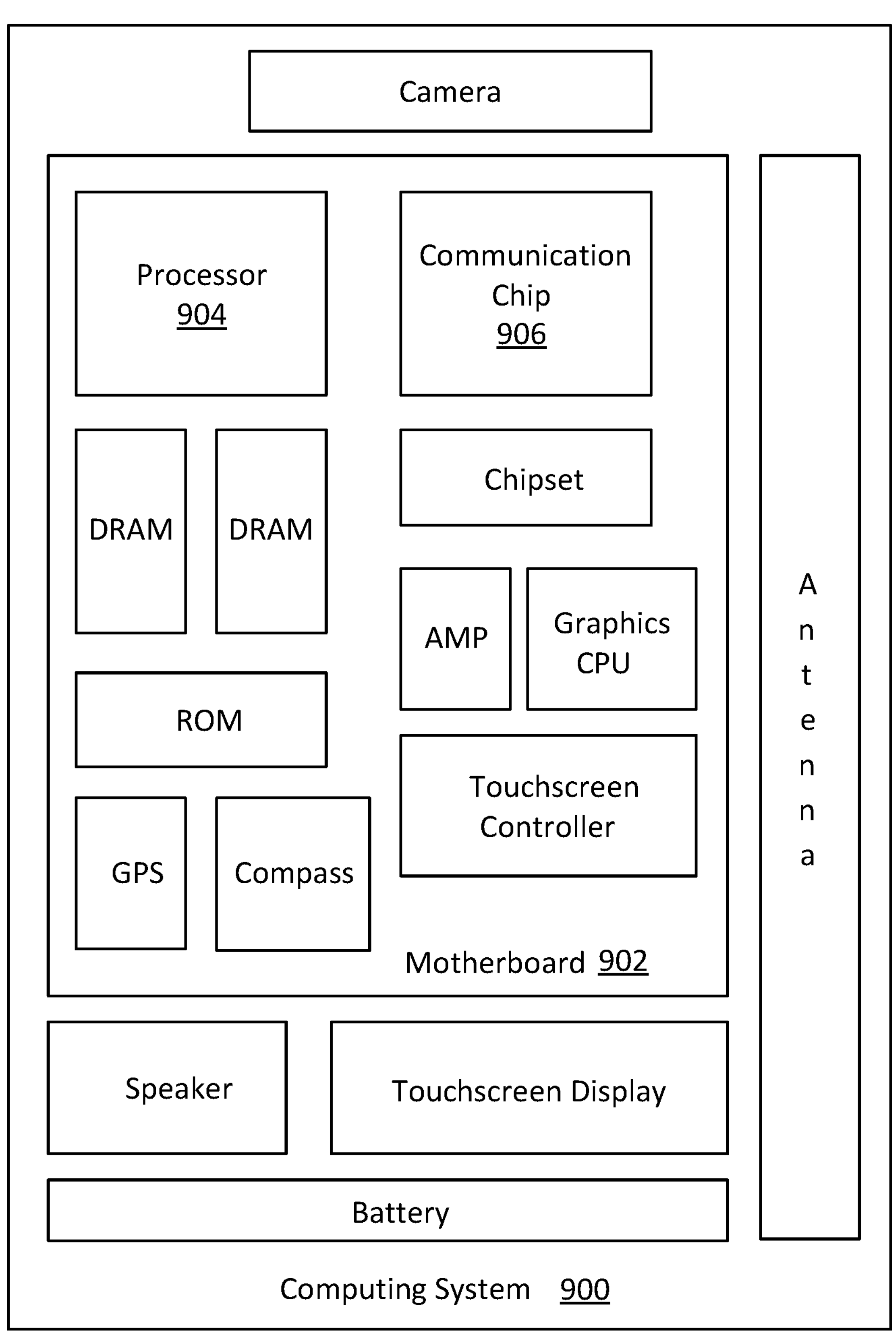
FIG. 9 illustrates a computing system including one or more integrated circuits, as variously described herein, in accordance with an embodiment of the present disclosure.

FIG. 9 is an example computing system implemented with one or more of the integrated circuit structures as disclosed herein, in accordance with some embodiments of the present disclosure. As can be seen, the computing system 900 houses a motherboard 902. The motherboard 902 may include a number of components, including, but not limited to, a processor 904 and at least one communication chip 906, each of which can be physically and electrically coupled to the motherboard 902, or otherwise integrated therein. As will be appreciated, the motherboard 902 may be, for example, any printed circuit board (PCB), whether a main board, a daughterboard mounted on a main board, or the only board of system 900, etc.

Depending on its applications, computing system 900 may include one or more other components that may or may not be physically and electrically coupled to the motherboard 902. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 900 may include one or more integrated circuit structures or devices configured in accordance with an example embodiment (e.g., a module including an integrated circuit device on a substrate, the substrate having a stacked configuration of semiconductor devices, as variously provided herein). In some embodiments, multiple functions can be integrated into one or more chips (e.g., for instance, note that the communication chip 906 can be part of or otherwise integrated into the processor 904).

The communication chip 906 enables wireless communications for the transfer of data to and from the computing system 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing system 900 includes an integrated circuit die packaged within the processor 904. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 906 also may include an integrated circuit die packaged within the communication chip 906. In accordance with some such example embodiments, the integrated circuit die of the communication chip includes one or more semiconductor devices as variously described herein. As will be appreciated in light of this disclosure, note that multi-standard wireless capability may be integrated directly into the processor 904 (e.g., where functionality of any chips 906 is integrated into processor 904, rather than having separate communication chips). Further note that processor 904 may be a chip set having such wireless capability. In short, any number of processor 904 and/or communication chips 906 can be used. Likewise, any one chip or chip set can have multiple functions integrated therein.

In various implementations, the computing system 900 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 900 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having one or more first bodies of semiconductor material extending in a first direction from a first source or drain region to a second source or drain region, and a second semiconductor device having one or more second bodies of semiconductor material extending in the first direction from a third source or drain region to a fourth source or drain region. The one or more second bodies of semiconductor material are spaced vertically from the one or more first bodies of semiconductor material in a second direction different from the first direction and the third source or drain region is spaced vertically from the first source or drain region in the second direction. The integrated circuit also includes a first spacer structure extending between ends of the one or more first bodies of semiconductor material and ends of the one or more second bodies of semiconductor material in the second direction, a second spacer structure extending in the second direction, the first source or drain region and the third source or drain region between the first spacer structure and the second spacer structure, and a stressor material adjacent to the second spacer structure, such that at least a portion of the second spacer structure is between the stressor material and the first source or drain region.

Example 2 includes the integrated circuit of Example 1, wherein the one or more first bodies of semiconductor material and the one or more second bodies of semiconductor material comprise germanium, silicon, or any combination thereof.

Example 3 includes the integrated circuit of Example 1 or 2, wherein the first source or drain region and the second source or drain region comprise silicon, germanium, and boron, and the third source or drain region and the fourth source or drain region comprise silicon and phosphorous.

Example 4 includes the integrated circuit of any one of Examples 1-3, wherein a vertical distance between the one or more first bodies of semiconductor material and the one or more second bodies of semiconductor material is between about 10 nm and about 80 nm.

Example 5 includes the integrated circuit of any one of Examples 1-4, wherein the stressor material is a compressive stressor material that comprises silicon and nitrogen. Other compressive stressor materials may be used as well.

Example 6 includes the integrated circuit of any one of Examples 1-4, wherein the stressor material is a tensile stressor material that comprises silicon and oxygen. Other tensile stressor materials may be used as well.

Example 7 includes the integrated circuit of any one of Examples 1-6, wherein the stressor material is a first stressor material and the portion of the second spacer structure is a first portion of the second spacer structure, and the integrated circuit further comprises a second stressor material adjacent to the second spacer structure, a second portion of the second spacer structure being between the second stressor material and the third source or drain region.

Example 8 includes the integrated circuit of Example 7, wherein the second stressor material is on the first stressor material.

Example 9 includes the integrated circuit of any one of Examples 1-8, further comprising a third spacer structure extending in the second direction, the stressor material extending between the second spacer structure and the third spacer structure in the first direction.

Example 10 includes the integrated circuit of any one of Examples 1-9, further comprising a third semiconductor device having one or more third bodies of semiconductor material extending in the first direction from the third source or drain region to a fifth source or drain region, wherein the one or more third bodies of semiconductor material are spaced vertically from the stressor material in the second direction.

Example 11 includes the integrated circuit of any one of Examples 1-10, further comprising one or more nubs of semiconductor material within the second spacer structure.

Example 12 includes the integrated circuit of Example 11, wherein the one or more nubs of semiconductor material contact both the first source or drain region and the stressor material.

Example 13 is a printed circuit board comprising the integrated circuit of any one of Examples 1-12.

Example 14 is an electronic device that includes a chip package having one or more dies. At least one of the one or more dies includes a first semiconductor device having one or more first semiconductor nanoribbons extending in a first direction from a first source or drain region to a second source or drain region, and a second semiconductor device having one or more second semiconductor nanoribbons extending in the first direction from a third source or drain region to a fourth source or drain region. The one or more second semiconductor nanoribbons are spaced vertically from the one or more first semiconductor nanoribbons in a second direction different from the first direction and the third source or drain region is spaced vertically from the first source or drain region in the second direction. The integrated circuit also includes a first spacer structure extending between ends of the one or more first semiconductor nanoribbons and ends of the one or more second semiconductor nanoribbons in the second direction, a second spacer structure extending in the second direction, the first source or drain region and the third source or drain region between the first spacer structure and the second spacer structure, and a stressor material adjacent to the second spacer structure, such that at least a portion of the second spacer structure is between the stressor material and the first source or drain region.

Example 15 includes the electronic device of Example 14, wherein the one or more first semiconductor nanoribbons and the one or more second semiconductor nanoribbons comprise germanium, silicon, or any combination thereof.

Example 16 includes the electronic device of Example 14 or 15, wherein the first source or drain region and the second source or drain region comprise silicon, germanium, and boron, and the third source or drain region and the fourth source or drain region comprise silicon and phosphorous.

Example 17 includes the electronic device of any one of Examples 14-16, wherein a vertical distance between the one or more first semiconductor nanoribbons and the one or more second semiconductor nanoribbons is between about 10 nm and about 80 nm.

Example 18 includes the electronic device of any one of Examples 14-17, wherein the stressor material is a compressive stressor material that comprises silicon and nitrogen. Other compressive stressor materials may be used as well.

Example 19 includes the electronic device of any one of Examples 14-17, wherein the stressor material is a tensile stressor material that comprises silicon and oxygen. Other tensile stressor materials may be used as well.

Example 20 includes the electronic device of any one of Examples 14-19, wherein the stressor material is a first stressor material, and the at least one of the one or more dies further comprises a second stressor material adjacent to the second spacer structure, such that a portion of the second spacer structure is between the second stressor material and the third source or drain region.

Example 21 includes the electronic device of Example 20, wherein the second stressor material is on the first stressor material.

Example 22 includes the electronic device of any one of Examples 14-21, wherein the at least one of the one or more dies further comprises a third spacer structure extending in the second direction, such that the stressor material extends between the second spacer structure and the third spacer structure in the first direction.

Example 23 includes the electronic device of any one of Examples 14-22, wherein the at least one of the one or more dies further comprises a third semiconductor device having one or more third semiconductor nanoribbons extending in the first direction between the third source or drain region and a fifth source or drain region, wherein the one or more third semiconductor nanoribbons are spaced vertically from the stressor material in the second direction.

Example 24 includes the electronic device of any one of Examples 14-23, wherein the at least one of the one or more dies further comprises one or more nanoribbon nubs within the second spacer structure.

Example 25 includes the electronic device of Example 24, wherein the one or more nanoribbon nubs contact both the first source or drain region and the stressor material.

Example 26 includes the electronic device of any one of Examples 14-25, further comprising a printed circuit board, wherein the chip package is attached to the printed circuit board.

Example 27 is an integrated circuit that includes a first semiconductor device having one or more first semiconductor nanoribbons extending in a first direction between a first p-doped source or drain region and a second p-doped source or drain region and a second semiconductor device having one or more second semiconductor nanoribbons extending in the first direction between a first n-doped source or drain region and a second n-doped source or drain region. the one or more second semiconductor nanoribbons are spaced vertically from the one or more first semiconductor nanoribbons in a second direction different from the first direction and the first n-doped source or drain region is spaced vertically from the first p-doped source or drain region in the second direction. The integrated circuit also includes a first spacer structure extending between ends of the one or more first semiconductor nanoribbons and ends of the one or more second semiconductor nanoribbons in the second direction, a second spacer structure extending in the second direction, such that the first n-doped source or drain region and the first p-doped source or drain region are between the first spacer structure and the second spacer structure, a compressive stressor material adjacent to the second spacer structure, such that a portion of the second spacer structure is between the compressive stressor material and the first p-doped source or drain region, and a tensile stressor material adjacent to the second spacer structure, such that a portion of the second spacer structure is between the tensile stressor material and the first n-doped source or drain region.

Example 28 includes the integrated circuit of Example 27, wherein the one or more first semiconductor nanoribbons and the one or more second semiconductor nanoribbons comprise germanium, silicon, or any combination thereof.

Example 29 includes the integrated circuit of Example 27 or 28, wherein the first p-doped source or drain region and the second p-doped source or drain region comprise silicon, germanium, and boron, and the first n-doped source or drain region and the second n-doped source or drain region comprise silicon and phosphorous.

Example 30 includes the integrated circuit of any one of Examples 27-29, wherein a vertical distance between the one or more first semiconductor nanoribbons and the one or more second semiconductor nanoribbons is between about 10 nm and about 80 nm.

Example 31 includes the integrated circuit of any one of Examples 27-30, wherein the compressive stressor material comprises silicon and nitrogen. Other compressive stressor materials may be used as well.

Example 32 includes the integrated circuit of any one of Examples 27-31, wherein the tensile stressor material comprises silicon and oxygen. Other tensile stressor materials may be used as well.

Example 33 includes the integrated circuit of any one of Examples 27-32, wherein the tensile stressor material is on the compressive stressor material.

Example 34 includes the integrated circuit of any one of Examples 27-33, further comprising one or more nanoribbon nubs within the second spacer structure.

Example 35 includes the integrated circuit of Example 34, wherein at least one of the nanoribbon nubs contacts both the first p-doped source or drain region and the compressive stressor material, and at least one of the nanoribbon nubs contacts both the first n-doped source or drain region and the tensile stressor material.

Example 36 is a printed circuit board comprising the integrated circuit of any one of Examples 27-35.

Example 37 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing each of the layers of the multilayer fin adjacent to the spacer structure; forming a first stressor material adjacent to a first portion of the spacer structure such that the first portion of the spacer structure is between the first stressor material and the first source or drain region; and forming a second stressor material adjacent to a second portion of the spacer structure such that the second portion of the spacer structure is between the second stressor material and the second source or drain region.

Example 38 includes the method of Example 37, wherein the first and third material layers comprise silicon and germanium and the second and fourth material layers comprise silicon.

Example 39 includes the method of Example 37 or 38, wherein the second section of the fin is separated from the first section of the fin by a vertical distance between about 10 nm and about 80 nm.

Example 40 includes the method of any one of Examples 37-39, wherein the first stressor material is a compressive stressor material and the second stressor material is a tensile stressor material.

Example 41 includes the method of Example 40, wherein the second stressor material is on the first stressor material.

Example 42 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing the first material layers and the third material layers; forming a protection layer around the fourth material layers; removing the second material layers; forming a stressor material adjacent to a portion of the spacer structure such that the portion of the spacer structure is between the stressor material and the first source or drain region; and forming a conductive material around the fourth material layers.

Example 43 includes the method of Example 42, wherein the first and third material layers comprise silicon and germanium and the second and fourth material layers comprise silicon.

Example 44 includes the method of Example 42 or 43, wherein the second section of the fin is separated from the first section of the fin by a vertical distance between about 10 nm and about 80 nm.

Example 45 includes the method of any one of Examples 42-44, wherein the stressor material is a compressive stressor material that includes silicon and nitrogen. Other compressive stressor materials may be used as well.

Example 46 includes the method of any one of Examples 42-44, wherein the stressor material is a tensile stressor material that includes silicon and oxygen. Other tensile stressor materials may be used as well.

Example 47 is a method of forming an integrated circuit. The method includes forming a multilayer fin having a first section with first material layers alternating with second material layers, the second material layers comprising a semiconductor material suitable for use as a nanoribbon channel, and a second section over the first section and comprising third material layers alternating with fourth material layers, wherein the fourth material layers comprise a semiconductor material suitable for use as a nanoribbon channel; forming a spacer structure around ends of the second and fourth material layers; forming a first source or drain region coupled to the ends of the second material layers; forming an insulator layer over the first source or drain region; forming a second source or drain region coupled to the ends of the fourth material layers and over the insulator layer; removing the first material layers and the third material layers; forming a conductive material around the second material layers; removing the fourth material layers; and forming a stressor material adjacent to a portion of the spacer structure such that the portion of the spacer structure is between the stressor material and the second source or drain region.

Example 48 includes the method of Example 47, wherein the first and third material layers comprise silicon and germanium and the second and fourth material layers comprise silicon.

Example 49 includes the method of Example 47 or 48, wherein the second section of the fin is separated from the first section of the fin by a vertical distance between about 10 nm and about 80 nm.

Example 50 includes the method of any one of Examples 47-49, wherein the stressor material is a compressive stressor material that includes silicon and nitrogen. Other compressive stressor materials may be used as well.

Example 51 includes the method of any one of Examples 47-49, wherein the stressor material is a tensile stressor material that includes silicon and oxygen. Other tensile stressor materials may be used as well.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:

a first semiconductor device having one or more first bodies of semiconductor material extending in a first direction from a first source or drain region to a second source or drain region;

a second semiconductor device having one or more second bodies of semiconductor material extending in the first direction from a third source or drain region to a fourth source or drain region, wherein the one or more second bodies of semiconductor material are spaced vertically from the one or more first bodies of semiconductor material in a second direction different from the first direction, the third source or drain region is spaced vertically from the first source or drain region in the second direction;

a first spacer structure extending between and contacting ends of the one or more first bodies of semiconductor material and ends of the one or more second bodies of semiconductor material, the first spacer structure extending in the second direction from a first horizontal plane at its bottommost surface to a second horizontal plane at its topmost surface;

a second spacer structure extending in the second direction from the first horizontal plane to the second horizontal plane, the first source or drain region and the third source or drain region between the first spacer structure and the second spacer structure; and a stressor material adjacent to the second spacer structure, such that at least a portion of the second spacer structure is between the stressor material and the first source or drain region.

2. The integrated circuit of claim 1, wherein the one or more first bodies of semiconductor material and the one or more second bodies of semiconductor material comprise germanium, silicon, or any combination thereof.

3. The integrated circuit of claim 1, wherein the first source or drain region and the second source or drain region comprise silicon, germanium, and boron, and the third source or drain region and the fourth source or drain region comprise silicon and phosphorous.

4. The integrated circuit of claim 1, wherein the stressor material comprises a compressive stressor material that comprises silicon and nitrogen.

5. The integrated circuit of claim 1, wherein the stressor material comprises a tensile stressor material that comprises silicon and oxygen.

6. The integrated circuit of claim 1, wherein the stressor material is a first stressor material and the portion of the second spacer structure is a first portion of the second spacer structure, and the integrated circuit further comprises a second stressor material adjacent to the second spacer structure, a second portion of the second spacer structure being between the second stressor material and the third source or drain region.

7. The integrated circuit of claim 1, further comprising a third semiconductor device having one or more third bodies of semiconductor material extending in the first direction from the third source or drain region to a fifth source or drain region, wherein the one or more third bodies of semiconductor material are spaced vertically from the stressor material in the second direction.

8. The integrated circuit of claim 1, further comprising one or more nubs of semiconductor material within the second spacer structure.

9. A printed circuit board comprising the integrated circuit of claim 1.

10. An electronic device, comprising:

a chip package comprising one or more dies, at least one of the one or more dies comprising a first semiconductor device having one or more first semiconductor nanoribbons extending in a first direction between a first source or drain region and a second source or drain region;

a second semiconductor device having one or more second semiconductor nanoribbons extending in the first direction between a third source or drain region and a fourth source or drain region, wherein the one or more second semiconductor nanoribbons are spaced vertically from the one or more first semiconductor nanoribbons in a second direction different from the first direction, the third source or drain region is spaced vertically from the first source or drain region in the second direction;

a first spacer structure extending between and contacting ends of the one or more first semiconductor nanoribbons and ends of the one or more second semiconductor nanoribbons in the second direction;

a second spacer structure extending in the second direction, wherein the first source or drain region and the third source or drain region are between the first spacer structure and the second spacer structure, and wherein a height of the second spacer structure along the second direction is substantially equal to a height of the first spacer structure along the second direction; and a stressor material adjacent to the second spacer structure, wherein a portion of the second spacer structure is between the stressor material and the first source or drain region.

11. The electronic device of claim 10, wherein the one or more first semiconductor nanoribbons and the one or more second semiconductor nanoribbons comprise germanium, silicon, or any combination thereof.

12. The electronic device of claim 10, wherein the stressor material is a first stressor material, and the at least one of the one or more dies further comprises a second stressor material adjacent to the second spacer structure, such that a portion of the second spacer structure is between the second stressor material and the third source or drain region.

13. The electronic device of claim 12, wherein the second stressor material is on the first stressor material.

14. The electronic device of claim 10, wherein the at least one of the one or more dies further comprises a third semiconductor device having one or more third semiconductor nanoribbons extending in the first direction between the third source or drain region and a fifth source or drain region, wherein the one or more third semiconductor nanoribbons are spaced vertically from the stressor material in the second direction.

15. The electronic device of claim 10, further comprising a printed circuit board, wherein the chip package is attached to the printed circuit board.

16. An integrated circuit, comprising:

a first semiconductor device having one or more first semiconductor nanoribbons extending in a first direction between a first p-doped source or drain region and a second p-doped source or drain region;

a second semiconductor device having one or more second semiconductor nanoribbons extending in the first direction between a first n-doped source or drain region and a second n-doped source or drain region, wherein the one or more second semiconductor nanoribbons are spaced vertically from the one or more first semiconductor nanoribbons in a second direction different from the first direction, the first n-doped source or drain region is spaced vertically from the first p-doped source or drain region in the second direction;

a first spacer structure extending between and contacting ends of the one or more first semiconductor nanoribbons and ends of the one or more second semiconductor nanoribbons in the second direction;

a second spacer structure extending in the second direction, such that the first n-doped source or drain region and the first p-doped source or drain region are between the first spacer structure and the second spacer structure, wherein an uppermost surface of the first spacer structure is coplanar with an uppermost surface of the second spacer structure, and a lowermost surface of the first spacer structure is coplanar with a lowermost surface of the second spacer structure;

a compressive stressor material adjacent to the second spacer structure, such that a portion of the second spacer structure is between the compressive stressor material and the first p-doped source or drain region; and a tensile stressor material adjacent to the second spacer structure, such that a portion of the second spacer structure is between the tensile stressor material and the first n-doped source or drain region.

17. The integrated circuit of claim 16, wherein the first p-doped source or drain region and the second p-doped source or drain region comprise silicon, germanium, and boron, and the first n-doped source or drain region and the second n-doped source or drain region comprise silicon and phosphorous.

18. The integrated circuit of claim 16, wherein the compressive stressor material comprises silicon and nitrogen.

19. The integrated circuit of claim 16, wherein the tensile stressor material comprises silicon and oxygen.

20. The integrated circuit of claim 16, wherein the tensile stressor material is on the compressive stressor material.

* * * * *